US011581340B2

(12) United States Patent
Hara et al.

(10) Patent No.: US 11,581,340 B2
(45) Date of Patent: Feb. 14, 2023

(54) ACTIVE MATRIX SUBSTRATE

(71) Applicant: Sharp Kabushiki Kaisha, Sakai (JP)

(72) Inventors: Kengo Hara, Sakai (JP); Tohru Daitoh, Sakai (JP); Tetsuo Kikuchi, Sakai (JP); Masahiko Suzuki, Sakai (JP); Setsuji Nishimiya, Sakai (JP); Hitoshi Takahata, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/546,105

(22) Filed: Dec. 9, 2021

(65) Prior Publication Data
US 2022/0189999 A1    Jun. 16, 2022

Related U.S. Application Data

(60) Provisional application No. 63/125,524, filed on Dec. 15, 2020.

(51) Int. Cl.
G02F 1/1362    (2006.01)
H01L 27/12     (2006.01)
(Continued)

(52) U.S. Cl.
CPC ........ *H01L 27/1225* (2013.01); *H01L 27/124* (2013.01); *H01L 29/7869* (2013.01);
(Continued)

(58) Field of Classification Search
CPC ........... H01L 29/78633; H01L 27/1225; H01L 27/124; H01L 29/7869; G02F 1/133345;
(Continued)

(56) References Cited

U.S. PATENT DOCUMENTS

2008/0225024 A1   9/2008 Ito
2010/0155721 A1*  6/2010 Lee .................. H01L 29/7869
                                                257/43
(Continued)

FOREIGN PATENT DOCUMENTS

JP    5-232508 A    9/1993
JP    2006-119404 A    5/2006
(Continued)

*Primary Examiner* — James A Dudek
(74) *Attorney, Agent, or Firm* — Keating & Bennett, LLP

(57) ABSTRACT

An active matrix substrate is provided with a plurality of oxide semiconductor TFTs including a plurality of first TFTs. An oxide semiconductor layer of each oxide semiconductor TFT includes a channel region, a source contact region, and a drain contact region. In a view from a normal direction of the substrate, the channel region is a region located between the source contact region and the drain contact region and overlapping a gate electrode, and the channel region includes a first end portion and a second end portion that oppose each other and extend in a first direction from the source contact region side toward the drain contact region side, a source side end portion that is located on the source contact region side of the first and second end portions and extends in a second direction that intersects the first direction, and a drain side end portion that is located on the drain contact region side of the first and second end portions and extends in the second direction. Each first TFT further includes a light blocking layer located between the oxide semiconductor layer and the substrate. In a view from the normal direction of the substrate, the light blocking layer includes an opening region that overlaps part of the channel region and a light blocking region that overlaps another part of the channel region. In a view from the normal direction of the substrate, the light blocking region includes a first light blocking portion that extends in the first direction over the first end portion of the channel region and a second light (Continued)

blocking portion that extends in the first direction over the second end portion of the channel region; each of the first light blocking portion and the second light blocking portion includes a first edge portion and a second edge portion that oppose each other and extend in the first direction; at least part of the first edge portion overlaps the channel region; and the second edge portion is located on an outer side of the channel region and does not overlap the channel region.

20 Claims, 20 Drawing Sheets

(51) Int. Cl.
   *H01L 29/786* (2006.01)
   *G02F 1/1343* (2006.01)
   *G02F 1/1333* (2006.01)
   *G02F 1/1368* (2006.01)

(52) U.S. Cl.
   CPC ...... *H01L 29/78633* (2013.01); *G02F 1/1368* (2013.01); *G02F 1/133345* (2013.01); *G02F 1/134309* (2013.01); *G02F 1/136209* (2013.01); *G02F 2202/10* (2013.01)

(58) Field of Classification Search
   CPC ............. G02F 1/134309; G02F 1/1368; G02F 2202/10; G02F 1/136209
   See application file for complete search history.

(56) References Cited

U.S. PATENT DOCUMENTS

| | | |
|---|---|---|
| 2012/0138922 A1 | 6/2012 | Yamazaki et al. |
| 2013/0038518 A1 | 2/2013 | Tagawa et al. |
| 2013/0320334 A1 | 12/2013 | Yamazaki et al. |
| 2014/0286076 A1 | 9/2014 | Aoki et al. |
| 2018/0350994 A1 | 12/2018 | Hosaka et al. |
| 2019/0131325 A1* | 5/2019 | Liu .................... H01L 27/32 |
| 2019/0244577 A1 | 8/2019 | Kusumi et al. |

FOREIGN PATENT DOCUMENTS

| | | |
|---|---|---|
| JP | 2008-225036 A | 9/2008 |
| JP | 2010-192019 A | 9/2010 |
| JP | 2012-134475 A | 7/2012 |
| JP | 2014-007399 A | 1/2014 |
| JP | 2014-209727 A | 11/2014 |
| JP | 2019-138923 A | 8/2019 |
| WO | 2011/118079 A1 | 9/2011 |
| WO | 2017/085591 A1 | 5/2017 |

* cited by examiner

| STEP 1<br>LOWER METAL LAYER | LOWER CONDUCTIVE FILM DEPOSITION |
|---|---|
| | PHOTOLITHOGRAPHY PROCESS |
| | LOWER CONDUCTIVE FILM ETCHING |
| STEP 2<br>LOWER INSULATING LAYER | LOWER INSULATING LAYER FORMATION |
| STEP 3<br>OXIDE SEMICONDUCTOR LAYER | OXIDE SEMICONDUCTOR LAYER DEPOSITION |
| | PHOTOLITHOGRAPHY PROCESS |
| | OXIDE SEMICONDUCTOR FILM ETCHING |
| STEP 4<br>GATE INSULATING LAYER<br>GATE METAL LAYER | GATE INSULATING FILM AND GATE CONDUCTIVE FILM DEPOSITION |
| | PHOTOLITHOGRAPHY PROCESS |
| | GATE CONDUCTIVE FILM AND GATE INSULATING FILM ETCHING |
| STEP 5<br>INTERLAYER INSULATING LAYER | INTERLAYER INSULATING LAYER DEPOSITION |
| | PHOTOLITHOGRAPHY PROCESS |
| | INTERLAYER INSULATING LAYER ETCHING |
| STEP 6<br>SOURCE METAL LAYER | SOURCE CONDUCTIVE FILM DEPOSITION |
| | PHOTOLITHOGRAPHY PROCESS |
| | SOURCE CONDUCTIVE FILM ETCHING |
| STEP 7<br>UPPER INSULATING LAYER | INORGANIC INSULATING LAYER DEPOSITION |
| | ORGANIC INSULATING LAYER (PHOTOLITHOGRAPHY PROCESS) |
| STEP 8<br>COMMON ELECTRODE | FIRST TRANSPARENT CONDUCTIVE FILM DEPOSITION |
| | PHOTOLITHOGRAPHY PROCESS |
| | FIRST TRANSPARENT CONDUCTIVE FILM ETCHING |
| STEP 9<br>DIELECTRIC LAYER | DIELECTRIC LAYER DEPOSITION |
| | PHOTOLITHOGRAPHY PROCESS |
| | DIELECTRIC LAYER/INORGANIC INSULATING LAYER ETCHING |
| STEP 10<br>PIXEL ELECTRODE | SECOND TRANSPARENT CONDUCTIVE FILM DEPOSITION |
| | PHOTOLITHOGRAPHY PROCESS |
| | SECOND TRANSPARENT CONDUCTIVE FILM ETCHING |

FIG. 19

ACTIVE MATRIX SUBSTRATE

CROSS-REFERENCE TO RELATED APPLICATIONS

This application claims the benefit of priority to U.S. Provisional Application No. 63/125524 filed on Dec. 15, 2020. The entire contents of the above-identified application are hereby incorporated by reference.

TECHNICAL FIELD

The disclosure relates to active matrix substrates.

BACKGROUND

An active matrix substrate used in a display device includes a display region including a plurality of pixel areas, and a non-display region that is a region other than the display region (also referred to as a "frame region" or "peripheral region"). The pixel area is an area corresponding to a pixel of the display device. A thin film transistor (hereinafter referred to as a "TFT") is disposed as a switching element in each pixel area.

It has been proposed in recent years to use an oxide semiconductor as a material of the active layer of a TFT in place of amorphous silicon and polycrystalline silicon. Such a TFT is referred to as an "oxide semiconductor TFT". The oxide semiconductor has a higher mobility than amorphous silicon. Thus, the oxide semiconductor TFT can operate at a higher speed than the amorphous silicon TFT. In addition, since an oxide semiconductor film is formed by a process simpler than that of a polycrystalline silicon film, the oxide semiconductor film can be applied to a device that requires a large area.

While many oxide semiconductor TFTs are bottom gate structure TFTs, top gate structure oxide semiconductor TFTs have been proposed as well. For example, WO 2017085591 discloses a top gate structure TFT in which a gate electrode is disposed on part of an oxide semiconductor layer with a gate insulating layer interposed therebetween.

In a non-display region of an active matrix substrate, a drive circuit such as a gate driver is formed monolithically (integrally) in some cases. By forming the drive circuit monolithically, the non-display region is narrowed and the mounting process is simplified, resulting in cost reduction. For example, in the non-display region, the gate driver circuit may be formed monolithically, and the source driver circuit may be mounted by a chip on glass (COG) process.

In a device such as a smartphone, where there is a strong demand for frame narrowing, it is proposed to monolithically form a demultiplexer circuit such as a source shared driving (SSD) circuit in addition to the gate driver. The SSD circuit is a circuit configured to distribute a display signal to a plurality of source bus lines from one video signal line connected to each of terminals of the source driver. The mounting of the SSD circuit makes it possible to further narrow a region (terminal section formation region) in which a terminal section is disposed in the non-display region. Additionally, the number of outputs from the source driver can be reduced and the circuit scale can be reduced, thereby reducing the cost of the driver IC.

Peripheral circuits such as a drive circuit and an SSD circuit include TFTs. In this specification, a TFT disposed as a switching element in each pixel of the display region is referred to as a "pixel TFT", and a TFT constituting a peripheral circuit is referred to as a "circuit TFT". Of the circuit TFTs, a TFT used as a switching element in the SSD circuit is referred to as an "SSD circuit TFT", and an TFT used in the gate driver circuit is referred to as a "gate driver circuit TFT". In an active matrix substrate using an oxide semiconductor TFT as a pixel TFT, from the perspective of the manufacturing process, it is desired to form an oxide semiconductor TFT, as a circuit TFT, using the same oxide semiconductor film as that of the pixel TFT.

SUMMARY

According to a study by the inventors, in some TFTs formed on an active matrix substrate, there is a risk that a threshold voltage of the TFT shifts in a positive direction (positive shift) by the drive of the active matrix substrate. As a result, desired TFT characteristics may not be obtained, and reliability of the active matrix substrate may be degraded. For example, in SSD circuit TFTs or some gate driver circuit TFTs, the positive shift of the threshold voltage is likely to increase. Details will be described below.

An embodiment of the disclosure provides an active matrix substrate including an oxide semiconductor TFT capable of suppressing a positive shift of the threshold voltage.

The present specification discloses active matrix substrates described in the following items.

Item 1

An active matrix substrate including:

a substrate;

a plurality of source bus lines and a plurality of gate bus lines that are supported by the substrate; and a plurality of oxide semiconductor TFTs supported by the substrate, each of the plurality of oxide semiconductor TFTs including an oxide semiconductor layer, a gate electrode disposed on part of the oxide semiconductor layer with a gate insulating layer interposed between the part of the oxide semiconductor layer and the gate electrode, a source electrode, and a drain electrode, wherein the oxide semiconductor layer includes a channel region, a source contact region electrically connected to the source electrode, and a drain contact region electrically connected to the drain electrode, the channel region is a region located between the source contact region and the drain contact region and overlapping the gate electrode in a view from a normal direction of the substrate, the channel region including, in a view from the normal direction of the substrate, a first end portion and a second end portion that oppose each other and extend in a first direction from the source contact region side toward the drain contact region side, a source side end portion that is located on the source contact region side of the first end portion and the second end portion and extends in a second direction that intersects the first direction, and a drain side end portion that is located on the drain contact region side of the first end portion and the second end portion and extends in the second direction, the plurality of oxide semiconductor TFTs include a plurality of first TFTs, and each of the plurality of first TFTs further includes a light blocking layer located between the oxide semiconductor layer and the substrate, the light blocking layer includes an opening region that overlaps part of the channel region and a light blocking region that overlaps another part of the channel region, in a view from the normal direction of the substrate, the light blocking region includes a first light blocking portion that extends in the first direction over the first end portion of the channel region and a second light blocking portion that extends in the first direction over the second end portion of the channel region, in a view from the normal direction of the substrate, and each of the first light blocking portion and the second light blocking portion includes a first edge portion and a second edge portion that oppose each other and extend in the first direction, at least part of the first edge portion overlaps the channel region, and the second edge portion is located on an outer side of the channel region and does not overlap the channel region, in a view from the normal direction of the substrate.

Item 2

The active matrix substrate according to item 1,
wherein, in each of the plurality of first TFTs, the light blocking layer further includes a third light blocking portion that extends in the second direction over the source side end portion of the channel region and a fourth light blocking portion that extends in the second direction over the drain side end portion of the channel region, in a view from the normal direction of the substrate, and each of the third light blocking portion and the fourth light blocking portion includes a third edge portion and a fourth edge portion that oppose each other and extend in the second direction, at least part of the third edge portion overlaps the channel region, and the fourth edge portion is located on the outer side of the channel region and does not overlap the channel region.

Item 3

The active matrix substrate according to item 1 or 2,
wherein, in each of the plurality of first TFTs, a length of a portion of the first end portion covered with the first light blocking portion is substantially equal to a length of a portion of the second end portion covered with the second light blocking portion.

Item 4

The active matrix substrate according to any one of items 1 to 3,
wherein, in each of the plurality of first TFTs, a width in a direction orthogonal to the first direction is not less than 3 μm and is less than half a channel width of each of the plurality of first TFTs in the first light blocking portion and the second light blocking portion.

Item 5

The active matrix substrate according to any one of items 1 to 4,
wherein, in each of the plurality of first TFTs, the light blocking layer further includes an intermediate light blocking portion that is located between the first light blocking portion and the second light blocking portion and at least partially overlaps the channel region, in a view from the normal direction of the substrate, and the opening region includes a first opening region and a second opening region that are disposed across the intermediate light blocking portion in a view from the normal direction of the substrate.

Item 6

An active matrix substrate including:
a substrate;
a plurality of source bus lines and a plurality of gate bus lines that are supported by the substrate; and
a plurality of oxide semiconductor TFTs supported by the substrate, each of the plurality of oxide semiconductor TFTs including an oxide semiconductor layer, a gate electrode disposed on part of the oxide semiconductor layer with a gate insulating layer interposed between the part of the oxide semiconductor layer and the gate electrode, a source electrode, and a drain electrode, wherein the oxide semiconductor layer includes a channel region, a source contact region electrically connected to the source electrode, and a drain contact region electrically connected to the drain electrode, the channel region is a region located between the source contact region and the drain contact region and overlapping the gate electrode in a view from a normal direction of the substrate, the channel region including, in a view from the normal direction of the substrate, a first end portion and a second end portion that oppose each other and extend in a first direction from the source contact region side toward the drain contact region side, a source side end portion that is located on the source contact region side of the first end portion and the second end portion and extends in a second direction that intersects the first direction, and a drain side end portion that is located on the drain contact region side of the first end portion and the second end portion and extends in the second direction, the plurality of oxide semiconductor TFTs include a plurality of first TFTs, and each of the plurality of first TFTs further includes a light blocking layer located between the oxide semiconductor layer and the substrate, the light blocking layer includes an opening region that overlaps part of the channel region and a light blocking region that overlaps another part of the channel region, in a view from the normal direction of the substrate, the light blocking region further includes a third light blocking portion that extends in the second direction over the source side end portion of the channel region and a fourth light blocking portion that extends in the second direction over the drain side end portion of the channel region, in a view from the normal direction of the substrate, and each of the third light blocking portion and the fourth light blocking portion includes a third edge portion and a fourth edge portion that oppose each other and extend in the second direction, at least part of the third edge portion overlaps the channel region, and the fourth edge portion is located on an outer side of the channel region and does not overlap the channel region.

Item 7

The active matrix substrate according to item 2 or 6,
wherein, in each of the plurality of first TFTs, a length of a portion of the source side end portion covered with the third light blocking portion is substantially equal to a length of a portion of the drain side end portion covered with the fourth light blocking portion.

Item 8

The active matrix substrate according to any one of items 2, 6, and 7, wherein, in each of the plurality of first TFTs, a width in a direction orthogonal to the second direction is not less than 3 μm and is less than half a channel length of each of the plurality of first TFTs in the third light blocking portion and the fourth light blocking portion.

Item 9

The active matrix substrate according to any one of items 1 to 8,
wherein, in each of the plurality of first TFTs, the opening region includes an opening, a notched portion, or a recessed portion of the light blocking layer in a view from the normal direction of the substrate.

Item 10

The active matrix substrate according to any one of items 1 to 9,
wherein, in at least some first TFTs among the plurality of first TFTs, the gate electrode includes a first gate portion and a second gate portion electrically connected to each other,
the channel region includes a first channel portion overlapping the first gate portion, and a second channel portion located on the drain electrode side relative to the first channel portion and overlapping the second gate portion, in a view from the normal direction of the substrate,
the light blocking layer includes a first layer overlapping part of the first channel portion and a second layer overlapping part of the second channel portion, in a view from the normal direction of the substrate,
the first end portion of the channel region includes an end portion that extends in the first direction in the first channel portion and the second channel portion, and the second end portion of the channel region includes an end portion that opposes the first end portion and extends in the first direction in the first channel portion and the second channel portion, and
the source side end portion is an end portion located on the source contact region side of the first channel portion, and the drain side end portion is an end portion located on the drain contact region side of the second channel portion.

Item 11

The active matrix substrate according to item 10,
wherein at least the some first TFTs further include an intermediate electrode, and the intermediate electrode is electrically connected to a portion located between the first channel portion and the second channel portion in the oxide semiconductor layer in a view from the normal direction of the substrate.

Item 12

The active matrix substrate according to any one of items 1 to 11,
wherein the channel region of each of the plurality of first TFTs includes a light-blocked portion overlapping the light blocking region of the light blocking layer and a light-irradiated portion overlapping the opening region of the light blocking layer in a view from the normal direction of the substrate, and a ratio AR of an area of the light-blocked portion to that of the channel region is in a range from 25% to 75%.

Item 13

The active matrix substrate according to any one of items 1 to 12,
wherein the active matrix substrate includes a display region having a plurality of pixel areas and a non-display region located around the display region and having a circuit formation region in which a peripheral circuit is formed, and
the plurality of first TFTs are disposed in the circuit formation region.

Item 14

The active matrix substrate according to item 13,
wherein the peripheral circuit includes an SSD circuit configured to distribute a display signal to a number n of source bus lines among the plurality of source bus lines, and
the plurality of first TFTs include a plurality of SSD circuit TFTs constituting the SSD circuit, and each of the plurality of SSD circuit TFTs supplies a video signal to one corresponding source bus line of the number n of source bus lines.

Item 15

The active matrix substrate according to item 14,
wherein no other TFT is formed between the plurality of SSD circuit TFTs and the display region.

Item 16

The active matrix substrate according to item 14 or 15,
wherein the SSD circuit further includes a plurality of compensation TFTs each connected to one corresponding source bus line of the number n of source bus lines,
a gate electrode of each of the plurality of compensation TFTs is supplied with a signal having a phase opposite to a phase of a control signal supplied to a gate electrode of the SSD circuit TFT that is connected to an identical source bus line, and
a first TFT formation region in which the plurality of SSD circuit TFTs are disposed is located between a second TFT formation region in which the plurality of compensation TFTs are disposed and the display region.

Item 17

The active matrix substrate according to any one of items 13 to 16,
wherein the peripheral circuit further includes a gate driver connected to the plurality of gate bus lines, and the plurality of first TFTs include a plurality of gate driver TFTs constituting the gate driver.

Item 18

The active matrix substrate according to any one of items 13 to 17,
wherein the plurality of oxide semiconductor TFTs further include second TFTs disposed in each of the plurality of pixel areas, and
each second TFT includes another light blocking layer located between the oxide semiconductor layer and the substrate, and the another light blocking layer overlaps an entirety of the channel region of the second TFT in a view from the normal direction of the substrate.

Item 19

The active matrix substrate according to any one of items 1 to 18, wherein the oxide semiconductor layer includes an In—Ga—Zn—O based semiconductor.

Item 20

The active matrix substrate according to item 19,
wherein the In—Ga—Zn—O based semiconductor includes a crystalline portion.

According to an embodiment of the disclosure, there is provided an active matrix substrate including an oxide semiconductor TFT capable of suppressing a positive shift of the threshold voltage.

BRIEF DESCRIPTION OF DRAWINGS

The disclosure will be described with reference to the accompanying drawings, wherein like numbers reference like elements.

FIG. 19 is a diagram illustrating a process flow for explaining an example of a manufacturing method for the active matrix substrate 1001.

DESCRIPTION OF EMBODIMENTS

Figure 1:
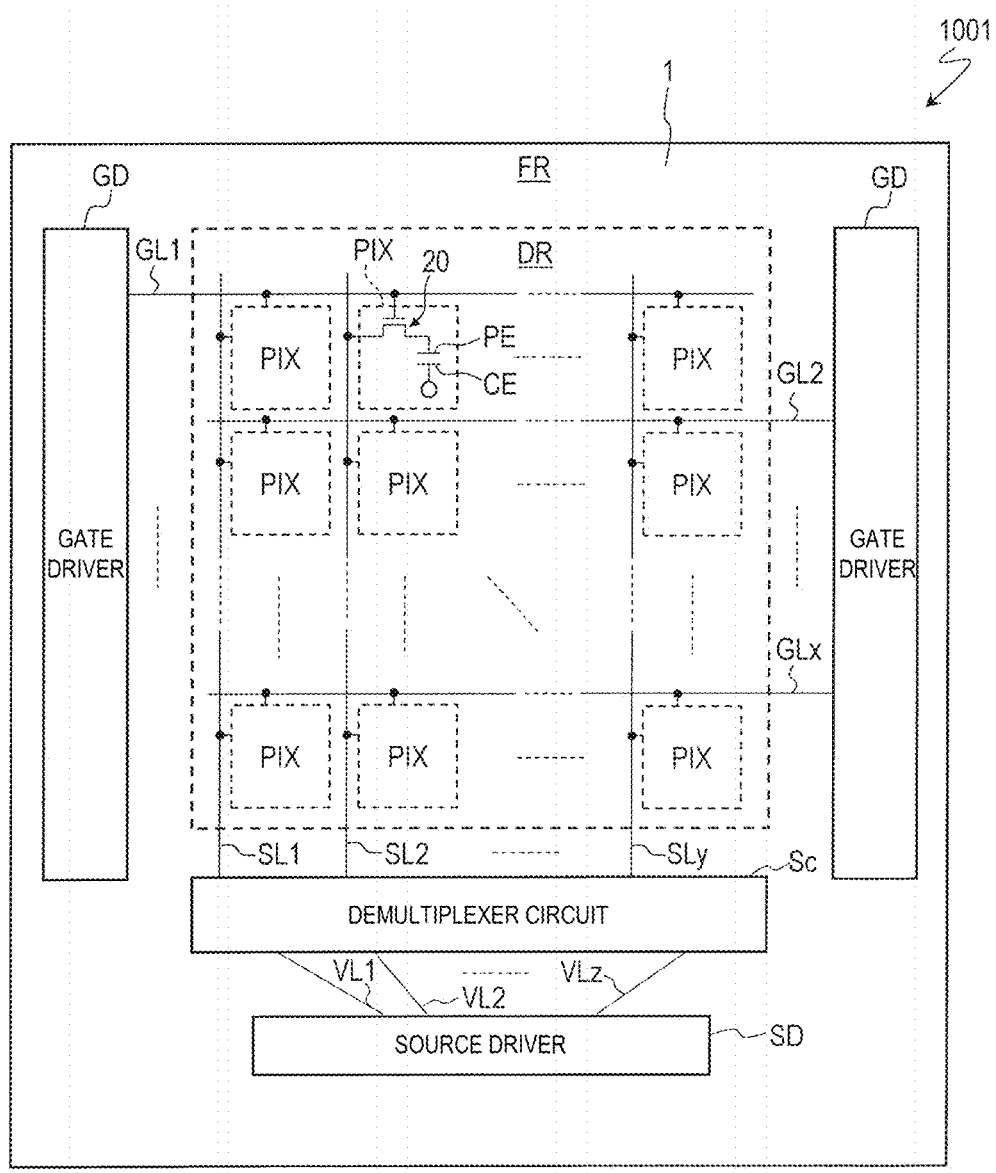
FIG. 1 is a schematic view illustrating an example of a planar structure of an active matrix substrate 1001.

As described above, the drive of the active matrix substrate causes a positive shift of the threshold voltage in some circuit TFTs, which leads to a problem that the desired characteristics are not obtained.

According to the study by the inventors, it has been found that the above problem is noticeably observed in a TFT, to the gate of which a predetermined control signal is applied at a high duty ratio during the action of the active matrix substrate. In such TFT, the ratio of an on-state period to one period (for example, one horizontal scan period) is large. Due to this, it is thought of that a positive shift of the threshold voltage is likely to accelerate with the action of the active matrix substrate, thereby increasing the shift amount. As a result, an action margin of the TFT becomes small, and in some cases, the TFT may be unable to act normally.

For example, during the drive of the active matrix substrate, a control signal is applied to the gate of the SSD circuit TFT at a high duty ratio (for example, approximately 33% or approximately 50%), so that a positive shift of the threshold voltage is likely to increase. In addition, a relatively large positive shift may occur in some of the gate driver circuit TFTs (for example, an output transistor).

Meanwhile, in an oxide semiconductor TFT, when light (for example, backlight light) is incident on the oxide semiconductor layer, there arises a problem that oxygen deficiency in the oxide semiconductor increases and the threshold voltage is shifted in a negative direction (negative shift). When a negative shift of the threshold voltage occurs, an off-leak current may increase or a depletion phenomenon (normally on state) may occur. To deal with this, in order to suppress the degradation (photodegradation) in TFT characteristics caused by the backlight light, a structure is known in which a light blocking layer is provided on the substrate side of the oxide semiconductor layer in a top gate structure oxide semiconductor TFT. In a bottom gate structure oxide semiconductor TFT, the gate electrode provided on the substrate side of the oxide semiconductor layer also functions as a light blocking layer, which makes it unnecessary to separately provide a light blocking layer.

In contrast, the inventors of the present application have discovered that a positive shift of the threshold voltage can be suppressed by using a change in characteristics caused by photodegradation in a top gate structure oxide semiconductor TFT. That is, light to be incident on the oxide semiconductor layer is not completely blocked by the light blocking layer, and a predetermined amount of light is intentionally allowed to be incident on the oxide semiconductor layer, thereby causing photodegradation. As a result, some or all of the shift amount of the threshold voltage in the positive direction that is generated accompanying the action of the active matrix substrate may be offset by the shift amount of the threshold voltage in the negative direction due to the photodegradation, thereby making it possible suppress the positive shift of the threshold voltage.

In order to allow a predetermined amount of light to enter the channel region, a configuration is conceivable in which a light blocking layer is provided in such a manner as to shield only part of the channel region from light, for example. However, when a light blocking layer for shielding only part of the channel region from light is disposed, the amount of light entering the channel region may not be controlled to the predetermined amount because the light blocking ratio with respect to the channel region (the area ratio of a portion of the channel region shielded from light (light-blocked portion)) changes in a case where an alignment shift is generated between the light blocking layer and the channel region. Thus, the inventors of the present application studied the structure of a TFT capable of suppressing a change in light blocking ratio due to the alignment shift, and have contrived the disclosure in the present application.

In an embodiment of the present disclosure, the light blocking layer includes a light blocking region able to shield the channel region from light, and an opening region that transmits light. The opening region may be, for example, an opening, a recessed portion, or a notched portion formed in the light blocking layer. By providing the opening region, the amount of light to be incident on the oxide semiconductor layer is adjusted. This makes it possible to improve reliability by suppressing the positive shift of the threshold voltage by utilizing photodegradation while ensuring high mobility. In addition, by disposing the light blocking region and the channel region in such a manner as to decrease a change in light blocking ratio with respect to the channel region even when the alignment shift occurs, it is possible suppress the degradation and a variation in TFT characteristics caused by the alignment shift.

First Embodiment

Hereinafter, an active matrix substrate according to a first embodiment will be described with reference to the accompanying drawings.

FIG. 1 is a diagram schematically illustrating an example of a planar structure of an active matrix substrate 1001. The active matrix substrate 1001 includes a display region DR contributing to display, and a peripheral region (frame region) FR located outside of the display region DR. The display region DR includes a plurality of pixel areas PIX arranged in a matrix shape. Each of the plurality of pixel areas PIX (also simply referred to as a "pixel") is an area corresponding to a pixel of the display device. The non-display region FR is a region positioned in a periphery of the display region DR and does not contribute to display.

The active matrix substrate 1001 includes, in the display region DR, a substrate 1, a plurality of pixel TFTs 20 supported by the substrate 1, a plurality of pixel electrodes PE, a plurality of gate bus lines GL1 to GLx (x is an integer of equal to or greater than 2, and hereinafter these gate bus lines are collectively referred to as "gate bus lines GL") configured to supply a gate signal to the pixel TFT 20, and a plurality of source bus lines SL1 to SLy (y is an integer of equal to or greater than 2, and hereinafter these source bus lines are collectively referred to as "source bus lines SL") configured to supply a source signal to the pixel TFT 20. Each of the plurality of pixel areas PIX is defined by the gate bus line GL and the source bus line SL, for example. The source bus line SL extends in a direction intersecting the gate bus line GL.

Each pixel TFT 20 and each pixel electrode PE are provided corresponding to one of the plurality of pixel areas PIX. A gate electrode of the pixel TFT 20 is electrically connected to one of the gate bus lines GL, and a source electrode thereof is electrically connected to one of the source bus lines SL. A drain electrode thereof is electrically connected to the pixel electrode PE.

When the active matrix substrate 1001 is applied to a display device of a transverse electrical field mode such as a fringe field switching (FFS) mode, an electrode (common electrode) CE common to the plurality of pixels PIX is provided in the active matrix substrate 1001.

A peripheral circuit such as a driver may be provided in the non-display region FR. For example, a gate driver GD configured to drive the gate bus lines GL, an SSD circuit Sc configured to drive the source bus lines SL by time division, and the like may be formed monolithically. The SSD circuit Sc is connected to a source driver SD mounted by a chip on glass (COG) technique, for example. The peripheral circuits such as the SSD circuit and the gate driver circuit each include a plurality of circuit TFTs.

The SSD circuit Sc is disposed between the source driver SD and the display region DR. The source driver SD includes a plurality of output terminals (not illustrated). A plurality of signal output lines (video signal lines) VL1 to VLz (z is an integer of equal to or greater than 2, and hereinafter these signal output lines are collectively referred to as "signal output lines VL") are provided in a region located between the source driver SD and the SSD circuit Sc. The SSD circuit Sc distributes a display signal supplied from one signal output line VL to two or more source bus lines SL (z<y). As a result, the number of output terminals (output pins) of the source driver SD can be reduced, so that the area of the non-display region FR may be further reduced (the frame is narrowed).

Structure of Oxide Semiconductor TFT

The active matrix substrate of the present embodiment includes a plurality of oxide semiconductor TFTs having a top gate structure. The plurality of oxide semiconductor TFTs include a TFT having a light blocking layer disposed to shield only part of the channel region from light (hereinafter referred to as a "first TFT").

The first TFT is not particularly limited, but may be, for example, a circuit TFT disposed in the non-display region. The active matrix substrate typically includes a plurality of the first TFTs, but a single first TFT is illustrated and its configuration is described below.

Figure 2A:
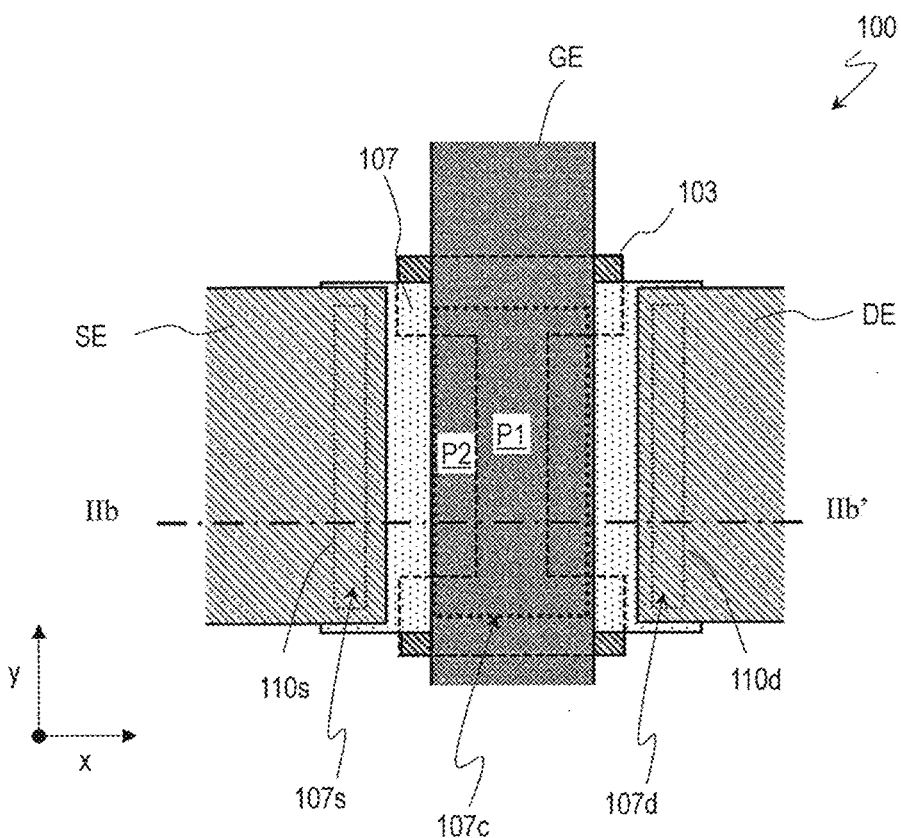
FIG. 2A is a plan view exemplifying a first TFT 100 in the active matrix substrate 1001.
Figure 2B:
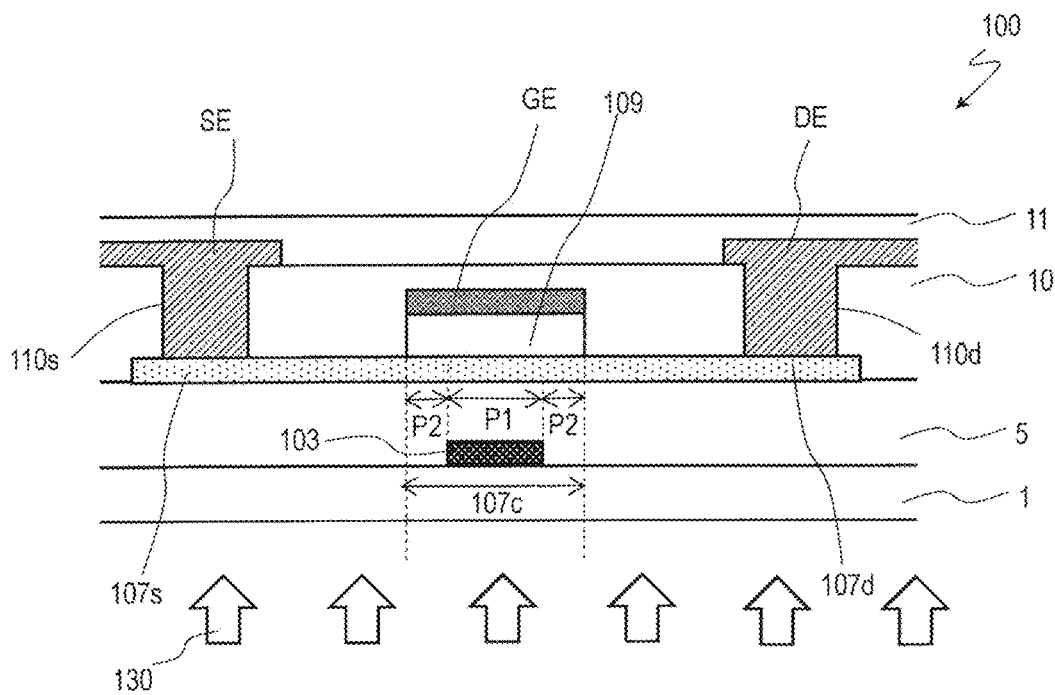
FIG. 2B is a cross-sectional view of the first TFT 100, in which a cross section taken along a line IIb-IIb' in FIG. 2A is illustrated.

FIG. 2A and FIG. 2B schematically illustrate a plan view and a cross-sectional view, respectively, exemplifying a first TFT 100. FIG. 2B illustrates a cross section taken along a line IIb-IIb' in FIG. 2A. A channel length direction of the first TFT 100 is defined as "x direction" and a direction orthogonal to the channel length direction (channel width direction) is defined as "y direction".

The first TFT 100 is supported by the substrate 1. The first TFT 100 includes a light blocking layer 103 disposed on the substrate 1, an oxide semiconductor layer 107 disposed on the light blocking layer 103 with a lower insulating layer 5 interposed therebetween, a gate insulating layer 109 disposed on the oxide semiconductor layer 107, a gate electrode GE disposed on the gate insulating layer 109, a source electrode SE, and a drain electrode DE.

The oxide semiconductor layer 107 includes a channel region 107c and first and second regions respectively located on both sides of the channel region 107c, when viewed from a normal direction of a main surface of the substrate 1.

The first region and the second region are low-resistive regions having specific resistance lower than that of the channel region 7c. The first region and the second region may be conductive regions. A portion 107s of the first region is electrically connected to the corresponding source bus line SL via the source electrode SE. A portion 107d of the second region is electrically connected to the drain electrode DE. In the present specification, the region 107s of the first region electrically connected to the source bus line SL is referred to as a "source contact region", and the region 107d of the second region electrically connected to the drain electrode DE is referred to as a "drain contact region". The "channel region 107c" refers to a region that overlaps the gate electrode GE and is located between the source contact region 107s and the drain contact region 107d when viewed from the normal direction of the substrate 1.

The light blocking layer 103 is located between the substrate 1 and the lower insulating layer 5. When viewed from the normal direction of the substrate 1, the light blocking layer 103 shields only part of the channel region 107c of the oxide semiconductor layer 107 (hereinafter, this structure is referred to as a "first light blocking structure"). The shape of the light blocking layer 103 will be described later.

The light blocking layer 103 may function as a lower electrode of the TFT 100. For example, the light blocking layer 103 may be electrically connected to the gate electrode GE (or to the corresponding gate bus line GL). Alternatively, the light blocking layer 103 may be fixed to a fixed potential (for example, a source potential). Alternatively, it may be in an electrically floating state.

The gate insulating layer 109 is so disposed as to cover part (at least the channel region 107c) of the oxide semiconductor layer 107 and not to cover the first region and the second region, for example. The gate insulating layer 109 may be located only between the oxide semiconductor layer 107 and the gate electrode GE. When viewed from the normal direction of the substrate 1, a circumferential edge of the gate insulating layer 109 (a circumferential edge of the upper face of the gate insulating layer 109 when the gate insulating layer 109 has a tapered shape) may be aligned with a circumferential edge of the gate electrode GE. Such a structure is obtained by patterning the gate insulating layer 109 while using a mask for patterning the gate electrode GE or using the gate electrode GE as a mask.

The gate electrode GE overlaps the channel region 107c of the oxide semiconductor layer 107 when viewed from the normal direction of the substrate 1. The gate electrode GE is formed using, for example, the same conductive film (gate conductive film) as that of the gate bus line GL. In the present specification, a layer including electrodes and wiring lines formed by using the gate conductive film is referred to as a "gate metal layer".

The oxide semiconductor layer 107, the gate insulating layer 109, and the gate electrode GE are covered with an interlayer insulating layer 10. As the interlayer insulating layer 10, a reductive insulating film (for example, a silicon nitride film) capable of reducing an oxide semiconductor may be used. This makes it possible to suppress an increase in specific resistance of a portion of the oxide semiconductor layer 107 in contact with the interlayer insulating layer 10 (the first region and second region). A source opening 110s exposing the source contact region 107s in the first region and a drain opening 110d exposing the drain contact region 107d in the second region are formed in the interlayer insulating layer 10.

The source electrode SE is formed on the interlayer insulating layer 10 and inside the source opening 110s, and is connected to the source contact region 107s of the oxide semiconductor layer 107 inside the source opening 110s. The drain electrode DE is formed on the interlayer insulating layer 10 and inside the drain opening 110d, and is connected to the drain contact region 107d of the oxide semiconductor layer 107 inside the drain opening 110d. The source electrode SE and the drain electrode DE may be formed using the same conductive film as that of the source bus line SL. In the present specification, a layer including electrodes and wiring lines formed by using the source conductive film is referred to as a "source metal layer".

The source metal layer and the interlayer insulating layer 10 may be covered with an inorganic insulating layer (passivation film) 11.

Arrangement Relationship between Channel Region 107c and Light Blocking Layer 103

Figure 3A:
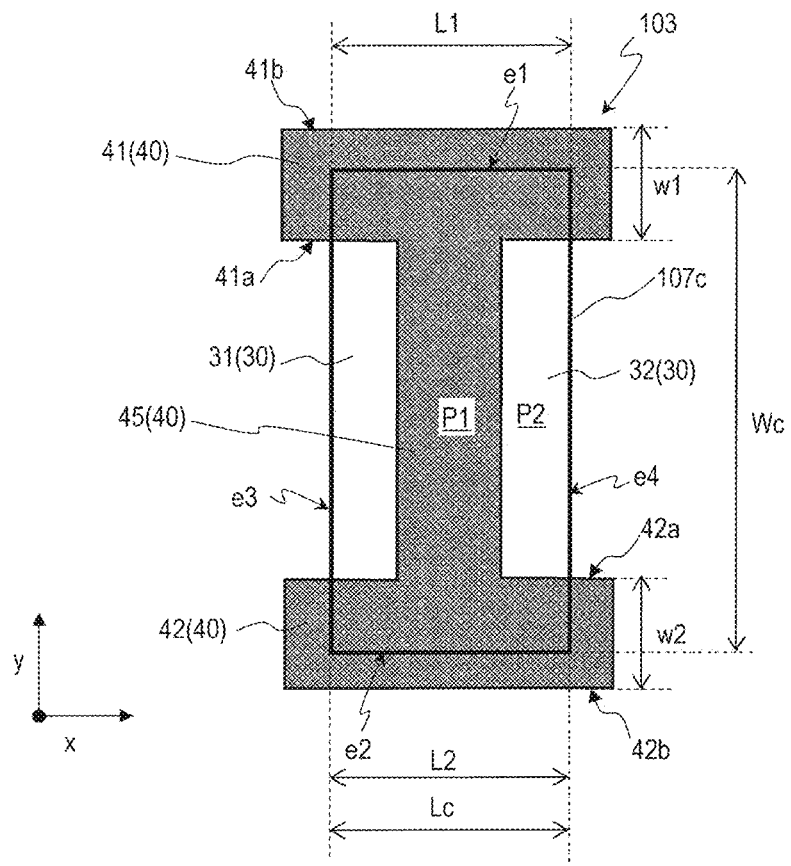
FIG. 3A is a plan view illustrating an example of an arrangement relationship between a light blocking layer 103 and a channel region 107c in the first TFT 100.

FIG. 3A is a plan view illustrating an example of an arrangement relationship between the light blocking layer 103 and the channel region 107c in the first TFT 100. For simplicity, constituent elements other than the light blocking layer 103 and the channel region 107c are not illustrated.

As illustrated in FIG. 3A, when viewed from the normal direction of the substrate 1, the channel region 107c includes a first end portion e1 and a second end portion e2 opposing each other and extending in a first direction from the source contact region 107s side toward the drain contact region 107d side, a source side end portion e3 located on the source contact region 107s side of the first end portion e1 and the second end portion e2 and extending in a second direction intersecting the first direction, and a drain side end portion e4 located on the drain contact region 107d side of the first end portion e1 and the second end portion e2 and extending in the second direction. The first direction is substantially parallel to the channel length direction (x direction) of the first TFT, for example. The second direction may be a direction orthogonal to the x direction, and may be substantially parallel to the channel width direction (y direction) of the first TFT, for example. As illustrated in the drawing, the circumferential edge of the channel region 17c is formed in a substantially rectangular shape, and the four sides thereof may be the first end portion e1, the second end portion e2, the source side end portion e3, and the drain side end portion e4, respectively.

The light blocking layer 103 has one or a plurality of opening regions (regions able to transmit visible light) 30 at least partially overlapping the channel region 107c. When viewed from the normal direction of the substrate 1, the opening region 30 may be an opening, a notched portion, or a recessed portion provided in the light blocking layer 103.

In the example illustrated in FIG. 3A, the light blocking layer 103 includes a first opening region 31 and a second opening region 32 as the opening region 30. The first opening region 31 is a recessed portion provided in an edge portion on the source contact region 107s side of the light blocking layer 103, and the second opening region 32 is a recessed portion provided in an edge portion on the drain contact region 107d side of the light blocking layer 103.

Of the light blocking layer 103, a region 40 other than the opening region 30 (a region having a function of blocking visible light) is referred to as a "light blocking region". The light blocking region 40 of the light blocking layer 103 includes a first light blocking portion 41 extending in the first direction over the first end portion e1 of the channel region 107c, and a second light blocking portion 42 extending in the first direction over the second end portion e2 of the channel region 107c. Each of the first light blocking portion 41, the second light blocking portion 42, the first end portion e1, and the second end portion e2 may extend in the x direction (channel length direction). The opening region 30 may be located between the first light blocking portion 41 and the second light blocking portion 42.

The first light blocking portion 41 has a first edge portion 41a and a second edge portion 41b opposing each other and extending in the first direction. When viewed from the normal direction of the substrate 1, at least part of the first edge portion 41a overlaps the channel region 107c (that is, it is located inside the channel region 107c). The second edge portion 41b is located outside of the channel region 107c and does not overlap the channel region 107c. The second light blocking portion 42 similarly has a first edge portion 42a and a second edge portion 42b opposing each other and extending in the first direction. When viewed from the normal direction of the substrate 1, at least part of the first edge portion 42a overlaps the channel region 107c, while the second edge portion 42b is located outside of the channel region 107c and does not overlap the channel region 107c.

The light blocking region 40 of the light blocking layer 103 may further include an intermediate light blocking portion 45 located inside the channel region 107c when viewed from the normal direction of the substrate 1. In this example, the intermediate light blocking portion 45 extends in a direction intersecting the first direction (in this case, in the y direction). Both ends of the intermediate light blocking portion 45 are respectively in contact with the first light blocking portion 41 and the second light blocking portion 42, and the first opening region 31 and the second opening region 32 are disposed across the intermediate light blocking portion 45 (in other words, disposed on both sides of the intermediate light blocking portion 45).

When viewed from the normal direction of the substrate 1, the channel region 107c includes a light-blocked portion P1 overlapping the light blocking region 40 of the light blocking layer 103, and a light-irradiated portion P2 not overlapping the light blocking region 40 of the light blocking layer 103. The light-irradiated portion P2 includes a portion of the channel region 107c overlapping the opening region 30 of the light blocking layer 103. In the present specification, an area ratio P1/(P1+P2) (%) of the light-blocked portion P1 with respect to the overall channel region 107c is referred to as a "light blocking ratio AR" in the channel region 107c.

Effect

In the first TFT 100 of the present embodiment, the light blocking layer 103 includes the opening region 30 overlapping part of the channel region 107c and the light blocking region 40 overlapping another part thereof when viewed from the normal direction of the substrate 1. This makes it possible to allow a predetermined amount of light (in this case, part of backlight light 130) to enter the channel region 107c as illustrated in FIG. 2B. By allowing the backlight light 130 to enter the channel region 107c of the oxide semiconductor layer 107, a negative shift of the threshold voltage by photodegradation is intentionally generated. This may offset the shift amount of the threshold voltage in the positive direction, which may decrease a threshold voltage change ΔVth.

According to the present embodiment, by adjusting the position, size, and number of the opening regions 30 provided in the light blocking layer 103, the light blocking ratio AR of the channel region 107c (that is, the area ratio P1/(P1+P2) of the light-blocked portion P1 in the channel region 107c) may be set to the predetermined value. This makes it possible to control the amount of light to be incident on the oxide semiconductor layer 107. The light blocking ratio AR may be, for example, not less than 25% and not greater than 75%. In a case where the light blocking ratio AR is excessively high, it may not be possible to sufficiently reduce the positive shift of the threshold voltage. On the other hand, in a case where the light blocking ratio AR is excessively low, the photodegradation of the oxide semiconductor layer 107 becomes large, which may raise a risk that the mobility is lowered.

According to the present embodiment, it is also possible to suppress a change in the area of the light-blocked portion P1 in the channel region 107c even when an alignment shift occurs between the light blocking layer 103 and the channel region 107c, for example, in the y direction (channel width direction). This will be described below with reference to the accompanying drawings.

Figures 3B, 3C:
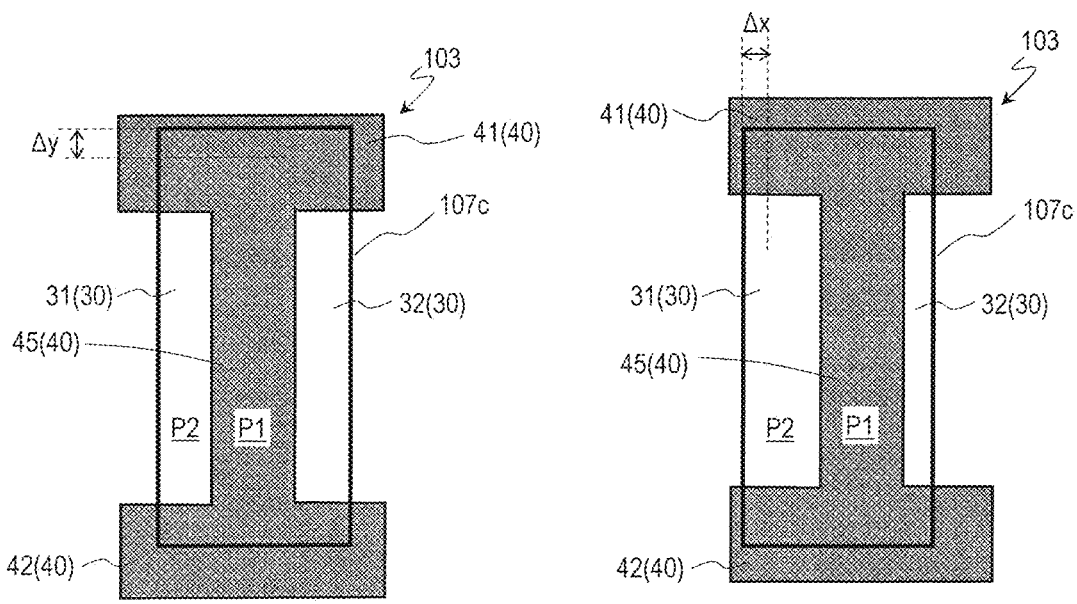
FIG. 3B is a plan view exemplifying an arrangement relationship between the light blocking layer 103 and the channel region 107c when an alignment shift is generated in a y direction.
FIG. 3C is a plan view exemplifying an arrangement relationship between the light blocking layer 103 and the channel region 107c when an alignment shift is generated in an x direction.

FIGS. 3B and 3C are plan views each exemplifying an arrangement relationship between the light blocking layer 103 and the channel region 107c when an alignment shift is generated in the y direction or x direction.

As illustrated in FIG. 3B, in the case where an alignment shift is generated in the y direction, when viewed from the normal direction of the substrate 1, the area of a portion of the first light blocking portion 41 overlapping the channel region 107c increases and the area of a portion of the second light blocking portion 42 overlapping the channel region 107c decreases, for example. In this way, the changes in the areas of the portions overlapping the channel region 107c may be compensated with each other by the first light blocking portion 41 and the second light blocking portion 42, whereby the amount of change in the area of the light-blocked portion P1 caused by the alignment shift may be decreased. Accordingly, it is possible to suppress the degradation, variation, and the like in the TFT characteristics due to the change in the light blocking ratio AR.

When viewed from the normal direction of the substrate 1, the first edge portion 41a of the first light blocking portion 41 and the first edge portion 42a of the second light blocking portion 42 may each traverse the channel region 107c in the x direction. That is, the first edge 41a and the first edge 42a may extend from the outside of the source side end portion e3 of the channel region 107c, across the channel region 107c, to the outside of the drain side end portion 4e of the channel region 107c. With this, as illustrated in FIG. 3C, the amount of change in the area of the light-blocked portion P1 in the channel region 107c may be suppressed when an alignment shift is generated in the x direction.

As illustrated in FIG. 3A, of the first end portion e1 of the channel region 107c, a length (first length) L1 of a portion covered by the light blocking region 40 (in this case, the first light blocking portion 41) of the light blocking layer 103, and a length (second length) L2 of a portion of the second end portion e2 covered by the light blocking region 40 (in this case, the second light blocking portion 42) of the light blocking layer 103 are preferably substantially equal to each other. As a result, regardless of the presence or absence of an alignment shift in the y direction, the area of the light-blocked portion P1 of the channel region 107c is substantially constant, thereby making it possible to achieve the desired light blocking ratio AR.

A width w1 of the first light blocking portion 41 of the light blocking layer 103 and a width w2 of the second light blocking portion 42 thereof are preferably greater than or equal to 3 μm. The widths w1 and w2 of the first light blocking portion 41 and the second light blocking portion 42 are widths in a direction orthogonal to the first direction (in this case, the y direction), and refer to the minimum width thereof when the width of each light blocking region is not constant. The amount of shift in alignment is, for example, less than 1.5 μm. Accordingly, by setting the widths w1 and w2 to be 3 μm or greater, it is possible to more reliably suppress the change in the light blocking ratio AR due to the alignment shift. On the other hand, the widths w1 and w2 of the first light blocking portion 41 and the second light blocking portion 42 may be, for example, less than half a channel width Wc, and preferably less than a quarter the channel width Wc. This makes it possible to dispose the opening region 30 having a predetermined area. In a case that, for example, the first TFT is provided in a pixel area, a high pixel aperture ratio may be secured.

The length of each of the first light blocking portion 41 and the second light blocking portion 42 in the x direction may be longer than a channel length Lc by 3 μm or more. With this, even when an alignment shift is generated in the x direction, the desired light blocking ratio AR may be more reliably achieved.

In the present specification, the channel width We refers to the shortest distance between the first end portion e1 and the second end portion e2 of the channel region 107c, and the channel length Lc refers to the shortest distance between the source side end portion e3 and the drain side end portion e4 of the channel region 107c.

As described below, the light blocking layer 103 may further include a third light blocking portion extending over the source side end portion e3 of the channel region 107c in the second direction intersecting the first direction, and a fourth light blocking portion extending in the second direction over the drain side end portion e4 of the channel region 107c.

Modified Example

Hereinafter, modified examples of the first TFT of the present embodiment will be described with reference to the accompanying drawings. In the following drawings, the same reference signs are assigned to the same constituent elements as those in FIGS. 2A to 3C. Descriptions of the same constituent elements will be omitted as appropriate.

Modified Example 1

Figure 4:
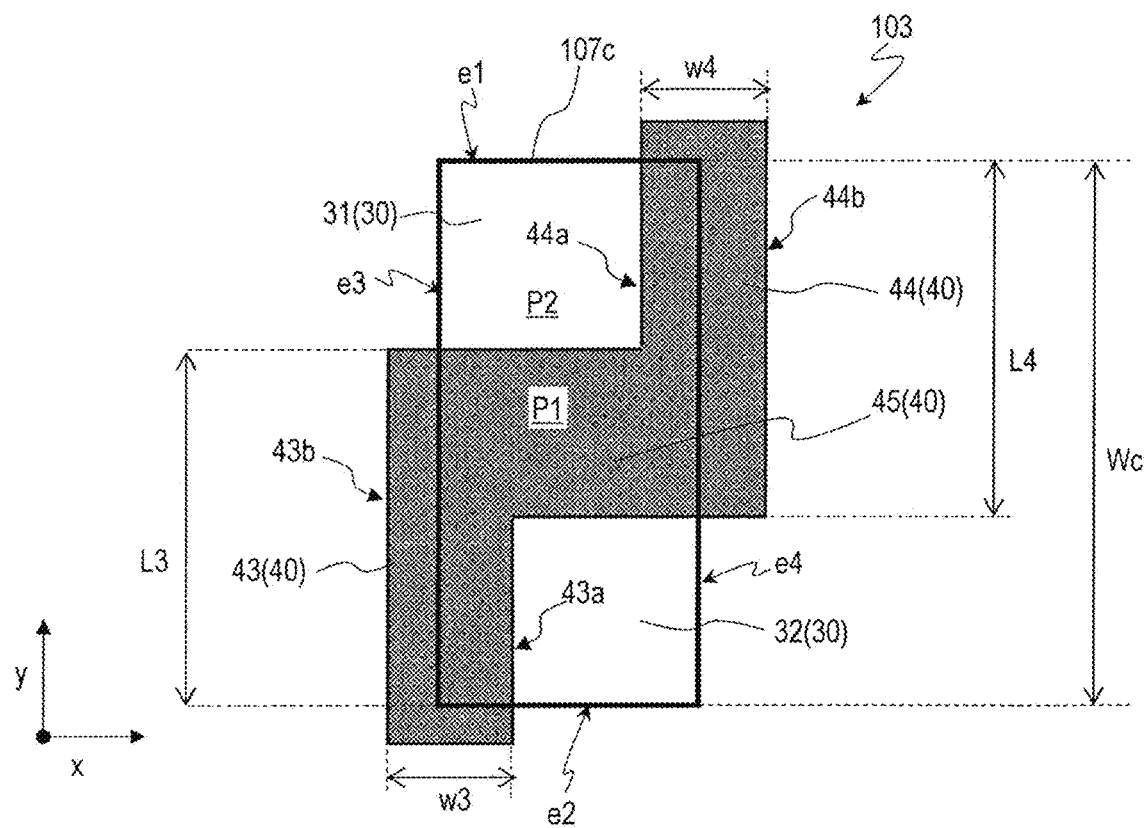
FIG. 4 is a plan view illustrating another example of an arrangement relationship between the light blocking layer 103 and the channel region 107c.

FIG. 4 is a plan view illustrating another example of an arrangement relationship between the light blocking layer 103 and the channel region 107c.

As illustrated in the drawing, the light blocking region 40 of the light blocking layer 103 may further include a third light blocking portion 43 extending over the source side end portion e3 of the channel region 107c in the second direction intersecting the first direction, and a fourth light blocking portion 44 extending in the second direction over the drain side end portion e4 of the channel region 107c. The second direction may be the y direction. In the illustrated example, the third light blocking portion 43, the fourth light blocking portion 44, the source side end portion e3, and the drain side end portion e4 extend substantially parallel to each other (in this case, along the y direction).

The third light blocking portion 43 has a third edge portion 43a and a fourth edge portion 43b opposing each other and extending in the second direction. When viewed from the normal direction of the substrate 1, at least part of the third edge portion 43a overlaps the channel region 107c, while the fourth edge portion 43b is located outside of the channel region 107c and does not overlap the channel region 107c. The fourth light blocking portion 44 similarly has a third edge portion 44a and a fourth edge portion 44b opposing each other and extending in the second direction. When viewed from the normal direction of the substrate 1, at least part of the third edge portion 44a overlaps the channel region 107c, while the fourth edge portion 44b is located outside of the channel region 107c and does not overlap the channel region 107c.

The light blocking region 40 of the light blocking layer 103 may further include the intermediate light blocking portion 45 located inside the channel region 107c when viewed from the normal direction of the substrate 1. In this example, the intermediate light blocking portion 45 extends in the first direction (in this case, the x direction). Both ends of the intermediate light blocking portion 45 are respectively in contact with the third light blocking portion 43 and the fourth light blocking portion 44.

The opening region 30 of the light blocking layer 103 includes the first opening region 31 and the second opening region 32. The first opening region 31 is a recessed portion provided in an edge portion on the source contact region 107s side of the light blocking layer 103, and the second opening region 32 is a recessed portion provided in an edge portion on the drain contact region 107d side of the light blocking layer 103. In this example, the first opening region 31 and the second opening region 32 are respectively disposed on both sides of the intermediate light blocking portion 45.

In this modified example as well, the threshold voltage change ΔVth may be reduced by partially shielding the channel region 107c from light. Further, by the light blocking layer 103 including the third light blocking portion 43 and the fourth light blocking portion 44, when an alignment shift is generated in the x direction, the third light blocking portion 43 and the fourth light blocking portion 44 are mutually able to compensate for area changes of the portions overlapping the channel region 107c when viewed from the normal direction of the substrate 1. As a result, the amount of change in the area of the light-blocked portion P1 caused by the alignment shift may be decreased. Accordingly, it is possible to suppress the degradation, variation, and the like in the TFT characteristics due to the change in the light blocking ratio AR.

Of the source side end portion e3 of the channel region 107c, a length (third length) L3 of a portion covered by the third light blocking portion 43 of the light blocking layer 103, and a length (fourth length) L4 of a portion of the drain side end portion e4 covered by the fourth light blocking portion 44 of the light blocking layer 103 are preferably substantially equal to each other. As a result, regardless of the presence or absence of an alignment shift in the x direction, the area of the light-blocked portion P1 of the channel region 107c is substantially constant, thereby making it possible to achieve the desired light blocking ratio AR.

In consideration of the amount of shift in alignment (for example, less than 1.5 μm), a width w3 of the third light blocking portion 43 of the light blocking layer 103 and a width w4 of the fourth light blocking portion 44 thereof are preferably greater than or equal to 3 μm. The widths w3 and w4 of the third light blocking portion 43 and the fourth light blocking portion 44 are widths in the x direction, and refer to the minimum width thereof when the width of each light blocking region is not constant.

In the illustrated example, the third length L3 of the third light blocking portion 43 is smaller than the channel width Wc, and the third light blocking portion 43 overlaps part of the second end portion e2 and is disposed being spaced apart from the first end portion e1 of the channel region 107c (for example, by approximately 1.5 μm or more). Likewise, the fourth length L4 of the fourth light blocking portion 44 is smaller than the channel width Wc, and the fourth light blocking portion 44 overlaps part of the first end portion e1 and is disposed being spaced apart from the second end portion e2 of the channel region 107c (for example, by approximately 1.5 μm or more). With this, a change in area of the light-blocked portion P1 in the channel region 107c may be more effectively suppressed when an alignment shift is generated in the y direction.

Although not illustrated, the third edge portion 43a of the third light blocking portion 43 and the third edge portion 44a of the fourth light blocking portion 44 may respectively extend traversing the channel region 107c in the y direction. As a result, regardless of the presence or absence of an alignment shift in the y direction, the area of the light-blocked portion P1 of the channel region 107c may be made substantially constant.

Modified Example 2

Figure 5A:
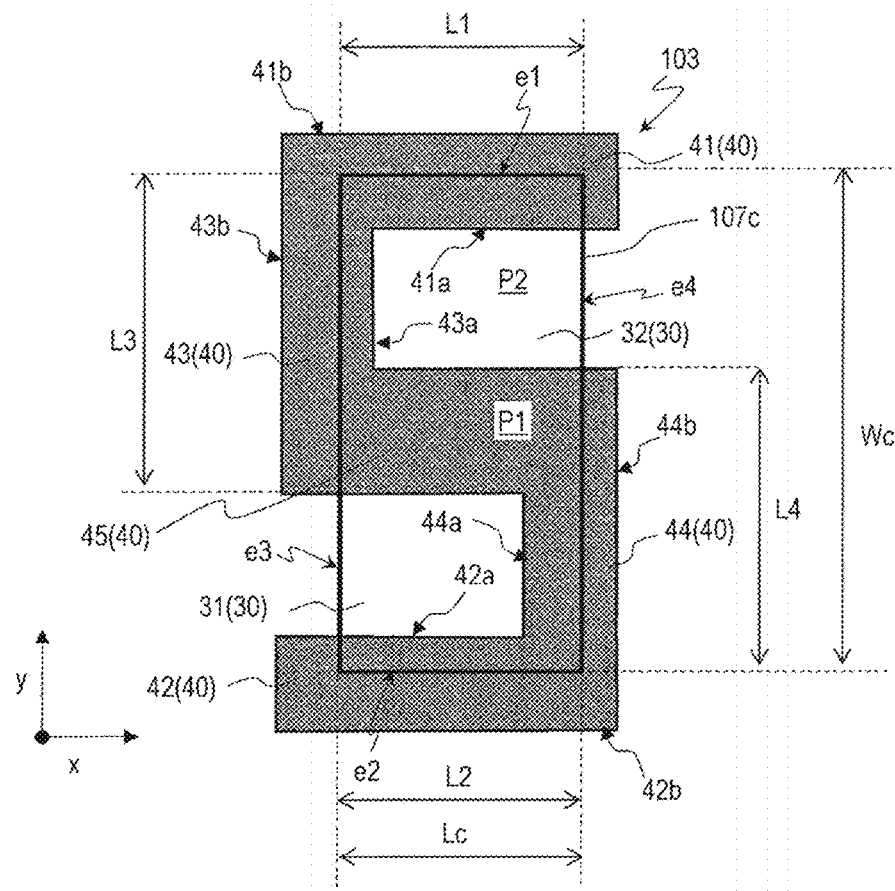
FIG. 5A is a plan view illustrating still another example of an arrangement relationship between the light blocking layer 103 and the channel region 107c.
Figures 5B, 5C:
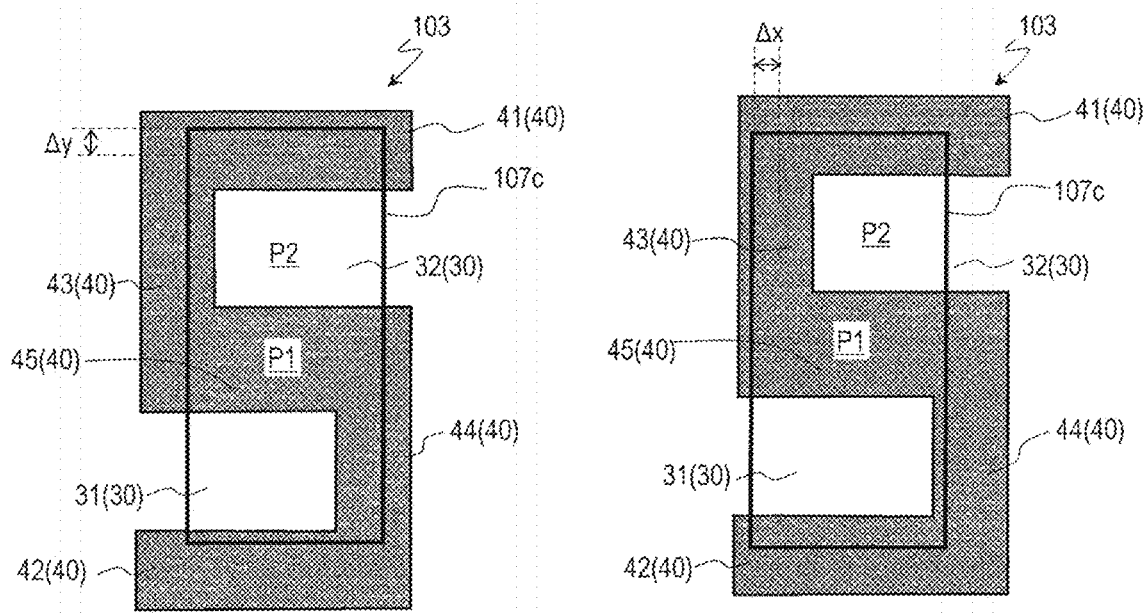
FIG. 5B is a plan view exemplifying an arrangement relationship between the light blocking layer 103 and the channel region 107c when an alignment shift is generated in the y direction.
FIG. 5C is a plan view exemplifying an arrangement relationship between the light blocking layer 103 and the channel region 107c when an alignment shift is generated in the x direction.

FIG. 5A is a plan view illustrating still another example of an arrangement relationship between the channel region 107c and the light blocking layer 103. FIGS. 5B and 5C are plan views each exemplifying an arrangement relationship between the light blocking layer 103 and the channel region 107c when an alignment shift is generated in the y direction or x direction.

In Modified Example 2, the light blocking region 40 of the light blocking layer 103 includes the first light blocking portion 41, the second light blocking portion 42, the third light blocking portion 43, the fourth light blocking portion 44, and the intermediate light blocking portion 45. When viewed from the normal direction of the substrate 1, the intermediate light blocking portion 45 is located between the first light blocking portion 41 and the second light blocking portion 42, and extends in the first direction. The light blocking region 40 of the light blocking layer 103 may have an S-shaped planar shape.

The first light blocking portion 41 extends in the first direction over the first end portion e1 of the channel region 107c, and the second light blocking portion 42 extends in the first direction over the second end portion e2 of the channel region 107c. The first edge portions 41a and 42a of the first light blocking portion 41 and the second light blocking portion 42 may respectively extend transversing the channel region 107c in the x direction (that is, the first length L1 and the second length L2 may be equal to the channel length Lc). The third light blocking portion 43 extends over the source side end portion e3 in the second direction so as to connect the end portions on the source side of the first light blocking portion 41 and the intermediate light blocking portion 45. The fourth light blocking portion 44 extends over the drain side end portion e4 in the second direction so as to connect the end portions on the drain side of the second light blocking portion 42 and the intermediate light blocking portion 45. As illustrated in the drawing, each of the first light blocking portion 41, the second light blocking portion 42, the intermediate light blocking portion 45, the first end portion e1, and the second end portion e2 may extend substantially parallel to each other in the x direction (channel length direction). Each of the third light blocking portion 43, the fourth light blocking portion 44, the source side end portion e3, and the drain side end portion e4 may extend substantially parallel to each other in the y direction (channel width direction).

The opening region 30 of the light blocking layer 103 includes the first opening region 31 and the second opening region 32. When viewed from the normal direction of the substrate 1, the first opening region 31 is, for example, a recessed portion provided in an edge portion on the source contact region side of the light blocking layer 103, and is located between the second light blocking portion 42 and the intermediate light blocking portion 45. The second opening region 32 is, for example, a recessed portion provided in an edge portion on the drain contact region side of the light blocking layer 103, and is located between the first light blocking portion 41 and the intermediate light blocking portion 45.

As illustrated in FIG. 5B, in the case where an alignment shift is generated in the y direction, when viewed from the normal direction of the substrate 1, the area of a portion of the first light blocking portion 41 overlapping the channel region 107c increases and the area of a portion of the second light blocking portion 42 overlapping the channel region 107c decreases, for example. Accordingly, the amount of change in the area of the light-blocked portion P1 caused by the alignment shift may be decreased. Meanwhile, as illustrated in FIG. 5C, in the case where an alignment shift is generated in the x direction, when viewed from the normal direction of the substrate 1, the area of a portion of the third light blocking portion 43 overlapping the channel region 107c increases and the area of a portion of the fourth light blocking portion 44 overlapping the channel region 107c decreases, for example. Accordingly, the amount of change in the area of the light-blocked portion P1 caused by the alignment shift may be decreased. As described above, according to the present modification, even when alignment shifts are generated in the x direction and the y direction, a predetermined light blocking ratio AR may be achieved, thereby making it possible to suppress the degradation, variation, and the like in the TFT characteristics.

In the present modified example as well, of the first end portion e1 of the channel region 107c, the length (first length) L1 of a portion covered by the light blocking region 40 (in this case, the first light blocking portion 41) of the light blocking layer 103, and the length (second length) L2 of a portion of the second end portion e2 covered by the light blocking region 40 (in this case, the second light blocking portion 42) of the light blocking layer 103 are preferably substantially equal to each other. Further, of the source side end portion e3 of the channel region 107c, the length (third length) L3 of a portion covered by the light blocking region 40 of the light blocking layer 103 (the third light blocking portion 43 in this case), and the length (fourth length) L4 of a portion of the drain side end portion e4 covered by the light blocking region 40 of the light blocking layer 103 (the fourth light blocking portion 44 in this case) are preferably substantially equal to each other. With this, the change in the TFT characteristics caused by the alignment may be more effectively suppressed.

Modified Example 3

Figure 6:
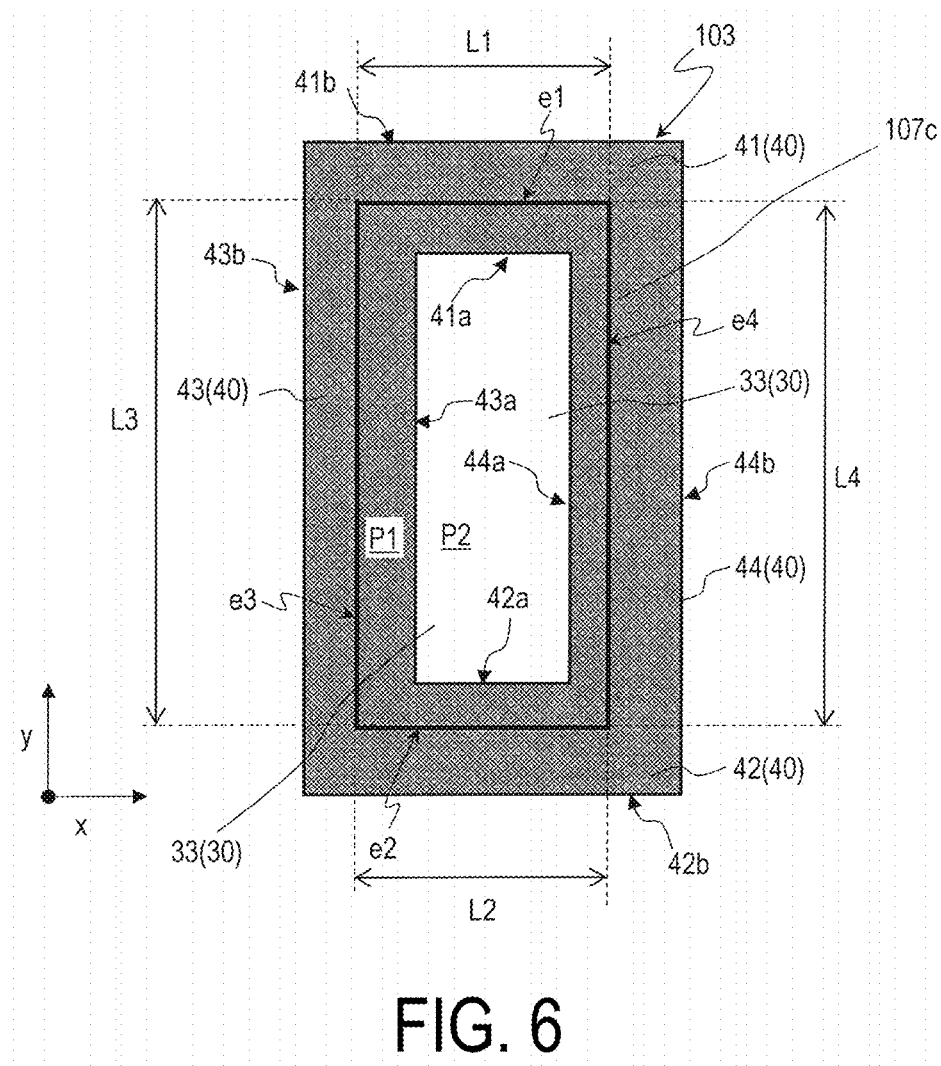
FIG. 6 is a plan view illustrating still another example of an arrangement relationship between the light blocking layer 103 and the channel region 107c.

FIG. 6 is a plan view illustrating still another example of an arrangement relationship between the channel region 107c and the light blocking layer 103.

As illustrated in the drawing, the light blocking region 40 of the light blocking layer 103 may cover the entire circumferential edge of the channel region 107c. In this modified example, the light blocking region 40 of the light blocking layer 103 includes the first light blocking portion 41, the second light blocking portion 42, the third light blocking portion 43, and the fourth light blocking portion 44. The third light blocking portion 43 extends to connect the end portions on the source side of the first light blocking portion 41 and the third light blocking portion 43. The fourth light blocking portion 44 extends to connect the end portions on the drain side of the second light blocking portion 42 and the fourth light blocking portion 44.

The light blocking layer 103 includes an opening 33 as the opening region 30. When viewed from the normal direction of the substrate 1, the opening 33 is surrounded by the first light blocking portion 41, the second light blocking portion 42, the third light blocking portion 43, and the fourth light blocking portion 44. Although not illustrated, two or more openings 33 may be provided in the light blocking layer 103.

Modified Example 4

The first TFT in the present embodiment may have a multi-channel structure in which a plurality of channel regions are disposed being spaced apart from each other in the oxide semiconductor layer. This will be described below while taking a TFT having a dual channel structure in which two channel regions are disposed as an example. Constituent elements similar to those in FIG. 2A to FIG. 3C are denoted by the same reference signs and description thereof will be omitted as appropriate.

Figure 7A:
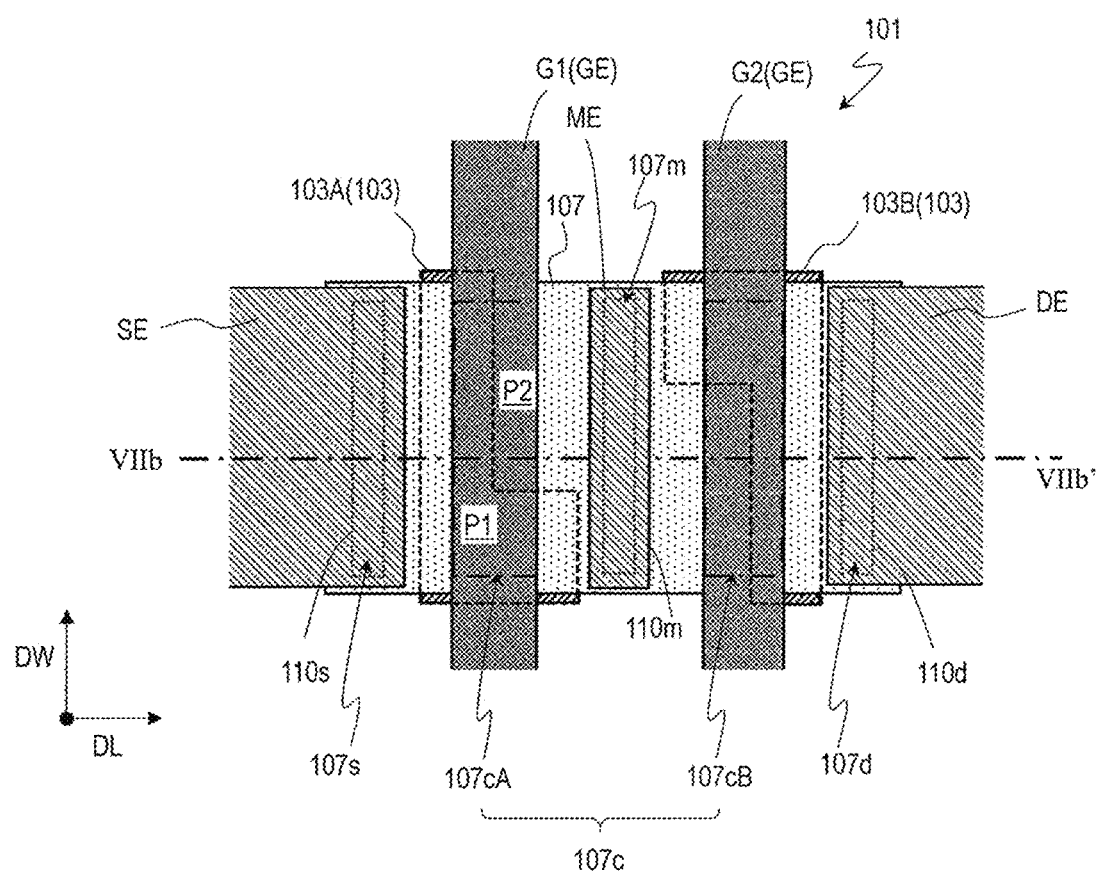
FIG. 7A is a plan view exemplifying a first TFT 101, which is another first TFT, in the active matrix substrate 1001.
Figure 7B:
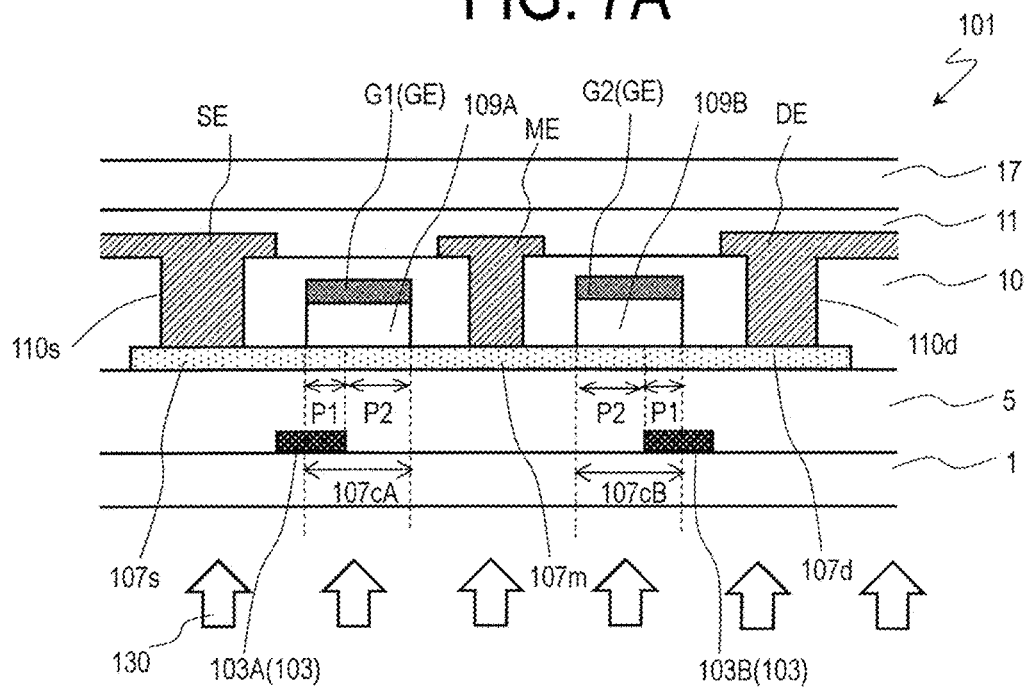
FIG. 7B is a cross-sectional view of the first TFT 101, in which a cross section taken along a line VIIb-VIIb' in FIG. 7A is illustrated.

FIG. 7A and FIG. 7B schematically illustrate a plan view and a cross-sectional view, respectively, exemplifying a first TFT 101 having a dual channel structure. FIG. 7B illustrates a cross section taken along a line VIIb-VIIb' in FIG. 7A.

The first TFT 101 has a dual channel structure, and electrically, has a structure equivalent to two serially connected TFTs.

The first TFT 101 includes a light blocking layer 103 disposed on a substrate 1, and an oxide semiconductor layer 107 disposed on the light blocking layer 103 with a lower insulating layer 5 interposed therebetween. The oxide semiconductor layer 107 includes a channel region 107c, and a first region and a second region arranged on both sides thereof.

The channel region 107c includes a first channel portion 107cA and a second channel portion 107cB. The region located between the first channel portion 107cA and the second channel portion 107cB is referred to as an "intermediate region". The first region, the second region, and the intermediate region may be low-resistive regions having specific resistance lower than that of the channel region 107c. The first region includes a source contact region 107s and the second region includes a drain contact region 107d. Although an example in which one intermediate region and two channel regions are included is given herein, no such limitation is intended, and two or more intermediate regions and three or more channel regions may be included.

The first TFT 101 further includes a source electrode SE electrically connected to the source contact region 107s, a drain electrode DE electrically connected to the drain contact region 107d, and an intermediate electrode ME electrically connected to the intermediate region. The intermediate electrode ME may be a so-called floating electrode that does not form an electrical connection in any portion. Of the intermediate region, a region 107m connected to the intermediate electrode ME is referred to as an "intermediate contact region". Note that the two channel portions 107cA and 107cB, the source contact region 107s, the drain contact region 107d, and the intermediate region 107m are all formed in one continuous oxide semiconductor layer 107.

A gate electrode GE includes a first gate portion G1 and a second gate portion G2. The first gate portion G1 and the second gate portion G2 may be electrically connected to each other. The first gate portion G1 is disposed over the first channel portion 107cA in the oxide semiconductor layer 107 with a gate insulating layer 109A interposed therebetween. The second gate portion G2 is disposed over the second channel portion 107cB with a gate insulating layer 109B interposed therebetween.

The light blocking layer 103 includes a first layer 103A disposed to partially overlap the first channel portion 107cA and a second layer 103B disposed to partially overlapping the second channel portion 107cB, when viewed from the normal direction of the substrate 1. In this example as well, the light blocking layer 103 may function as a lower electrode or may be fixed to a fixed potential. Alternatively, it may be in an electrically floating state.

Figure 8A:
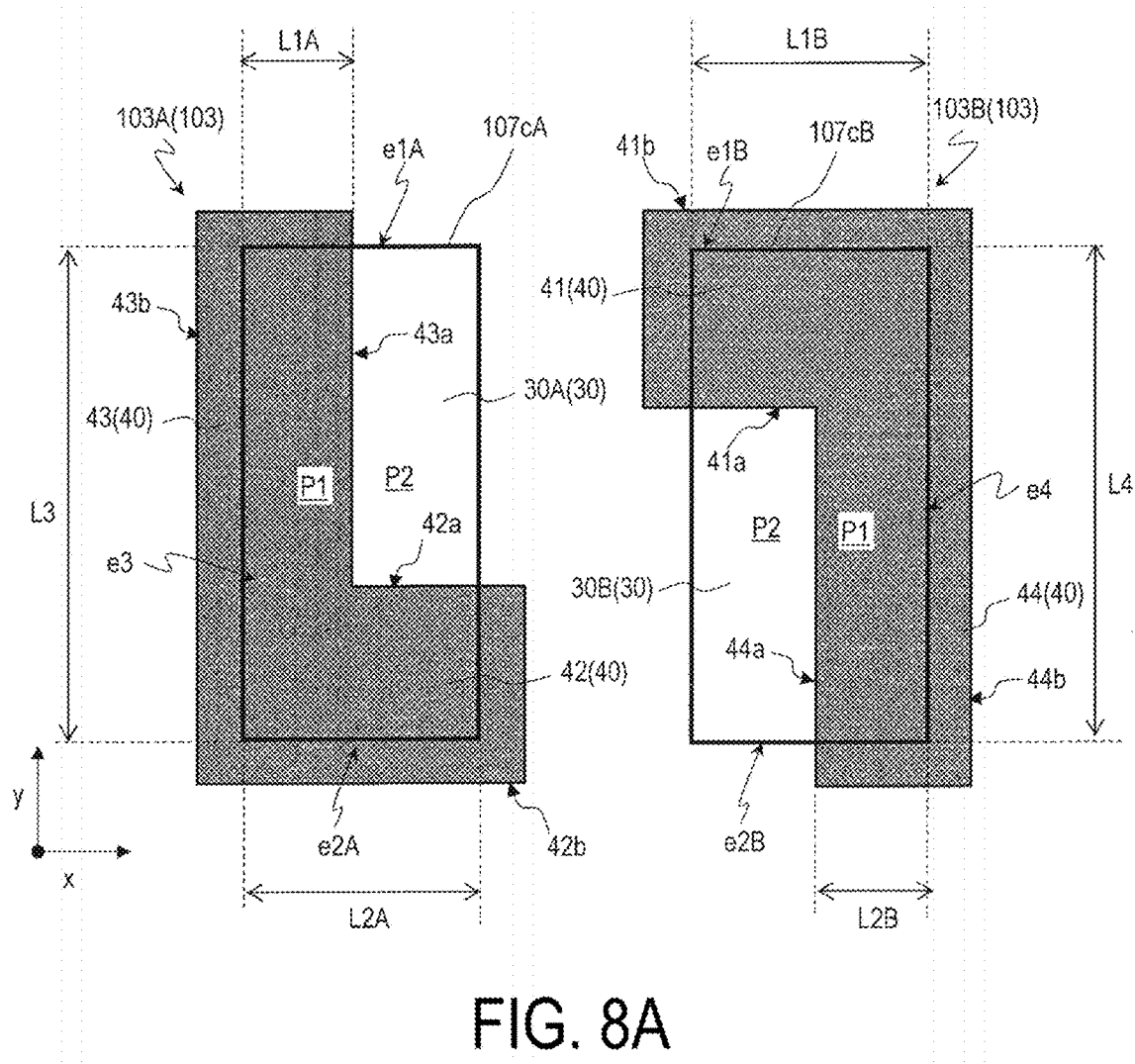
FIG. 8A is a plan view illustrating an example of an arrangement relationship between the light blocking layer 103 and the channel region 107c in the first TFT 101.
Figure 8B:
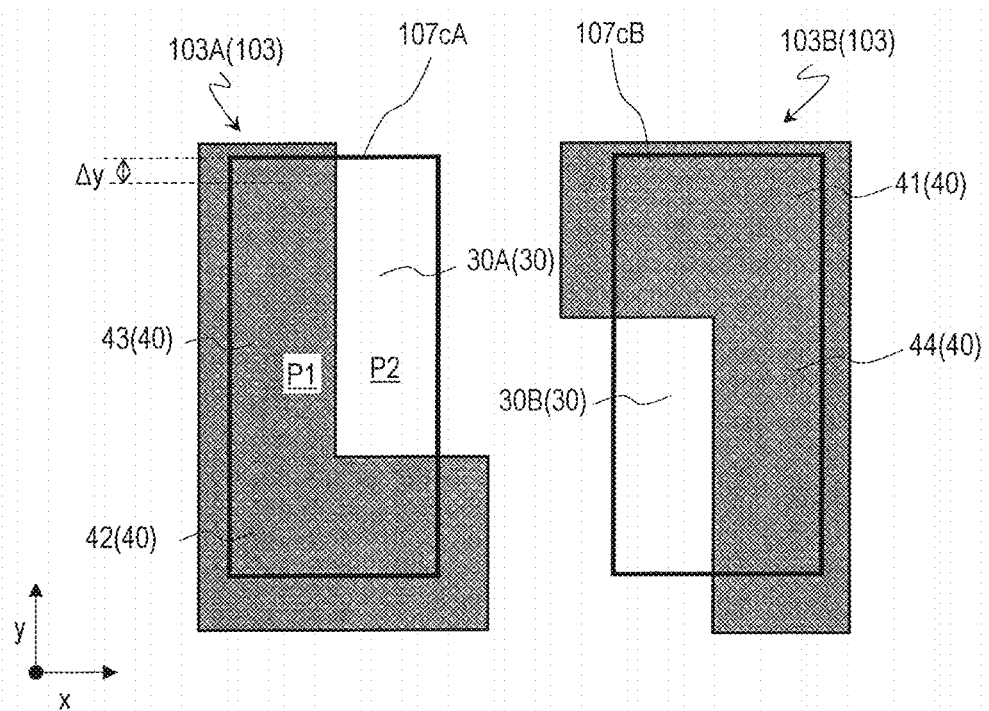
FIG. 8B is a plan view exemplifying an arrangement relationship between the light blocking layer 103 and the channel region 107c when an alignment shift is generated in the y direction.
Figure 8C:
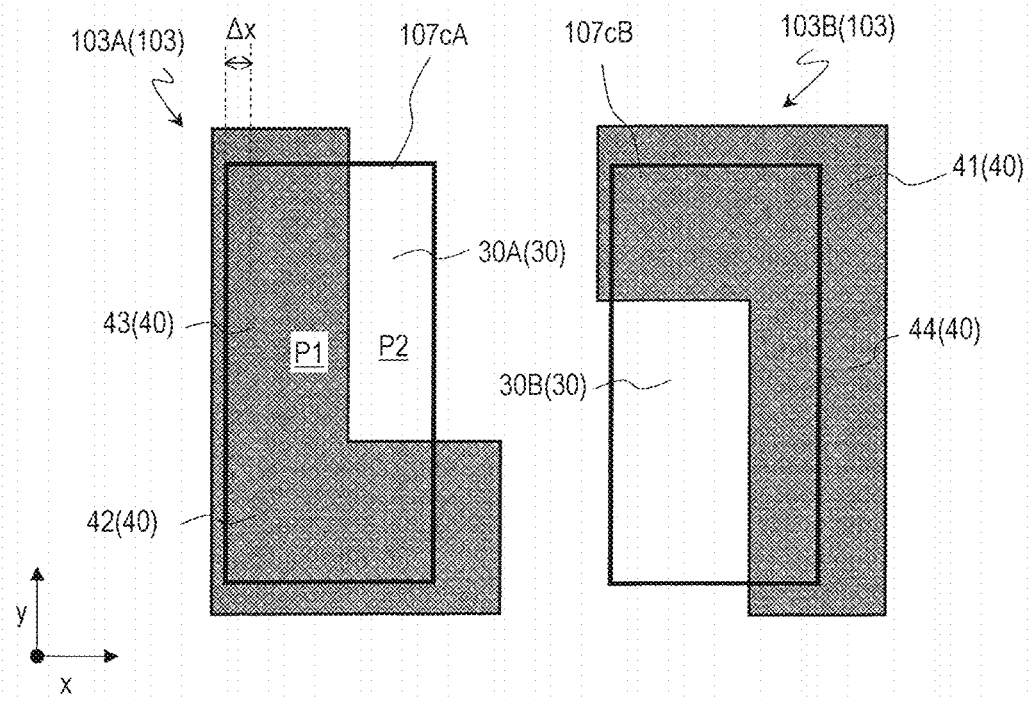
FIG. 8C is a plan view exemplifying an arrangement relationship between the light blocking layer 103 and the channel region 107c when an alignment shift is generated in the x direction.

FIG. 8A is a plan view exemplifying an arrangement relationship between the light blocking layer 103 and the channel region 107c in the first TFT 101. FIGS. 8B and 8C are plan views each exemplifying an arrangement relationship between the light blocking layer 103 and the channel region 107c when an alignment shift is generated in the y direction or x direction.

When viewed from the normal direction of the substrate 1, the first channel portion 107cA is a region that overlaps the first gate portion G1 and is located between the source contact region 107s and the intermediate region 107m. The second channel portion 107cB is a region that overlaps the second gate portion G2 and is located between the drain contact region 107d and the intermediate region 107m.

As illustrated in FIG. 8A, in the present modified example as well, when viewed from the normal direction of the substrate 1, the channel region 107c includes a first end portion e1 and a second end portion e2 opposing each other and extending in a first direction from the source contact region 107s toward the drain contact region 107d, and a source side end portion e3 and a drain side end portion e4 opposing each other and extending in a second direction intersecting the first direction.

When viewed from the normal direction of the substrate 1, the first end portion e1 includes end portions e1A and e1B extending in the first direction in the first channel portion 107cA and the second channel portion 107cB. Likewise, the second end portion e2 includes end portions e2A and e2B opposing the first end portion e1 and extending in the first direction in the first channel portion 107cA and the second channel portion 107cB. The source side end portion e3 is an end portion located on the source contact region 107s side and extending in the second direction in the first channel portion 107cA. The drain side end portion e4 is an end portion located on the drain contact region 107d side and extending in the second direction in the second channel portion 107cB.

The light blocking region 40 of the light blocking layer 103 includes a first light blocking portion 41 extending in the first direction over the first end portion e1 of the channel region 107c, a second light blocking portion 42 extending in the first direction over the second end portion e2, a third light blocking portion 43 extending in the second direction over the source side end portion e3, and a fourth light blocking portion 44 extending over the drain side end portion e4 in the second direction.

In the illustrated example, the first light blocking portion 41 and the third light blocking portion 43 are provided in the first layer 103A, while the second light blocking portion 42 and the fourth light blocking portion 44 are provided in the second layer 103B. An opening region 30 of the light blocking layer 103 includes an opening region 30A in the first layer 103A and an opening region 30B in the second layer 103B. More specifically, when viewed from the normal direction of the substrate 1, the first layer 103A of the light blocking layer 103 includes the second light blocking portion 42 extending in the first direction over the end portion e2A of the first channel portion 107cA, the third light blocking portion 43 extending in the second direction over the source side end portion e3, and the opening region (notched portion) 30A located on the drain side of the third light blocking portion 43. The second layer 103B includes the first light blocking portion 41 extending in the first direction over the end portion e1B of the second channel portion 107cB, the fourth light blocking portion 44 extending in the second direction over the drain side end portion e4, and the opening region (notched portion) 30B located on the source side of the fourth light blocking portion 44.

In the present modified example, as illustrated in FIG. 8B, in the case where an alignment shift is generated in the y direction, when viewed from the normal direction of the substrate 1, the area of a portion of the first light blocking portion 41 overlapping the channel region 107c increases and the area of a portion of the second light blocking portion 42 overlapping the channel region 107c decreases, for example. Accordingly, the amount of change in the area of a light-blocked portion P1 caused by the alignment shift may be decreased. Meanwhile, as illustrated in FIG. 8C, in the case where an alignment shift is generated in the x direction, when viewed from the normal direction of the substrate 1, the area of a portion of the third light blocking portion 43 overlapping the channel region 107c increases and the area of a portion of the fourth light blocking portion 44 overlapping the channel region 107c decreases, for example. Accordingly, the amount of change in the area of the light-blocked portion P1 caused by the alignment shift may be decreased. Thus, in the present modified example as well, even when alignment shifts are generated in the x direction and the y direction, a predetermined light blocking ratio AR may be achieved.

In the present modified example as well, it is preferable that a first length L1 and a second length L2 be substantially equal to each other. It is also preferable that a third length L3 and a fourth length L4 be substantially equal to each other. In the case where a multi-channel structure is included as in the present modified example, the above-mentioned lengths L1 to L4 are each the sum of the corresponding lengths in each channel portion. For example, the first length L1 is the sum of a length L1B of a portion covered by the first light blocking portion 41 and a length L1A of a portion covered by the third light blocking portion 43. The second length L2 is the sum of a length L2A of a portion covered by the second light blocking portion 42 and a length L2B of a portion covered by the fourth light blocking portion 44.

Modified Example 5

Figure 9:
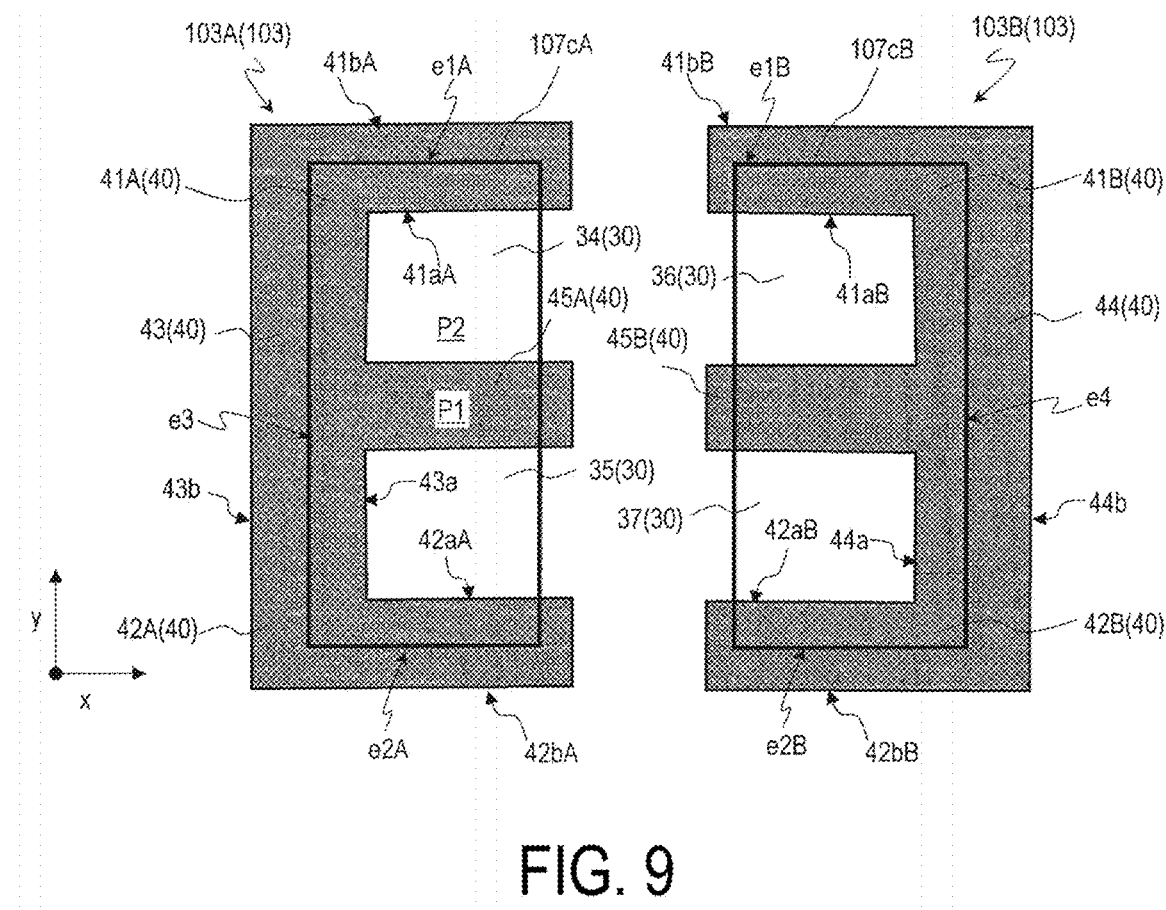
FIG. 9 is a plan view illustrating still another example of an arrangement relationship between the light blocking layer 103 and the channel region 107c.

FIG. 9 is a plan view illustrating another example of an arrangement relationship between the channel region 107c and the light blocking layer 103 in the first TFT 101.

The light blocking layer 103 of the present modified example differs from the light blocking layer 103 of Modified Example 4 in that the first light blocking portion 41 and the second light blocking portion 42 are formed across the first layer 103A and the second layer 103B, and that the light blocking region 40 further includes an intermediate light blocking portion 45.

In the present modified example, the first layer 103A has an E planar shape, and the second layer 103B has a right-and-left reversed E planar shape.

When viewed from the normal direction of the substrate 1, the first layer 103A of the light blocking layer 103 includes a light blocking portion 41A extending in the first direction over the end portion e1A of the first channel portion 107cA, a light blocking portion 42A extending in the first direction over the end portion e2A, a light blocking portion 45A located between the light blocking portions 41A and 42A and extending in the first direction, the third light blocking portion 43 extending in the second direction over the source side end portion e3, and opening regions 34 and 35. The third light blocking portion 43 extends to connect the end portions on the source side of the light blocking portions 41A, 42A, and 45A. The opening regions 34 and 35 are disposed across the light blocking portion 45A. The second layer 103B includes a light blocking portion 41B extending in the first direction over the end portion e1B of the second channel portion 107cB, a light blocking portion 42B extending in the first direction over the end portion e2B, a light blocking portion 45B located between the light blocking portions 41B and 42B and extending in the first direction, the fourth light blocking portion 44 extending in the second direction over the drain side end portion e4, and opening regions 36 and 37. The fourth light blocking portion 44 extends to connect the end portions on the drain side of the light blocking portions 41B, 42B, and 45B. The opening regions 36 and 37 are disposed across the light blocking portion 45B.

In the present modified example, the first light blocking portion 41 of the light blocking layer 103 includes the light blocking portion 41A of the first layer 103A and the light blocking portion 41B of the second layer 103B. The second light blocking portion 42 includes the light blocking portion 42A of the first layer 103A and the light blocking portion 42B of the second layer 103B. The intermediate light blocking portion 45 includes the light blocking portion 45A of the first layer 103A and the light blocking portion 45B of the second layer 103B. The opening region 30 includes the opening regions 34 and 35 of the first layer 103A and the opening regions 36 and 37 of the second layer 103B.

Modified Example 6

Figure 10A:
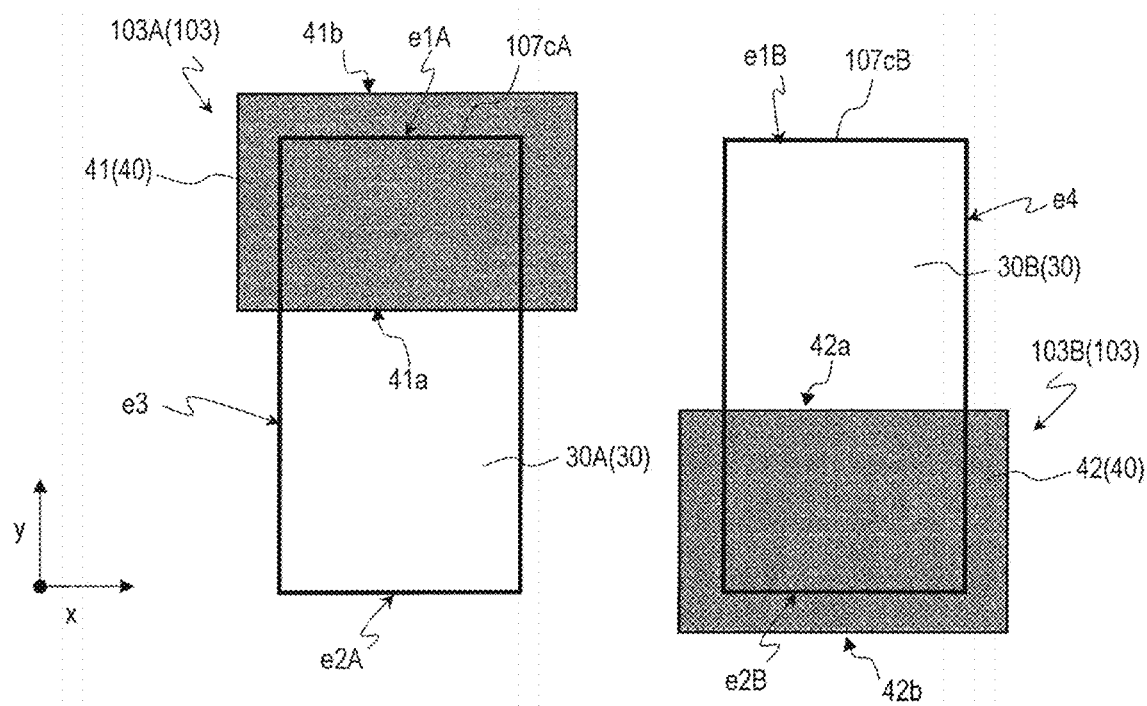
FIG. 10A is a plan view illustrating still another example of an arrangement relationship between the light blocking layer 103 and the channel region 107c.
Figure 10B:
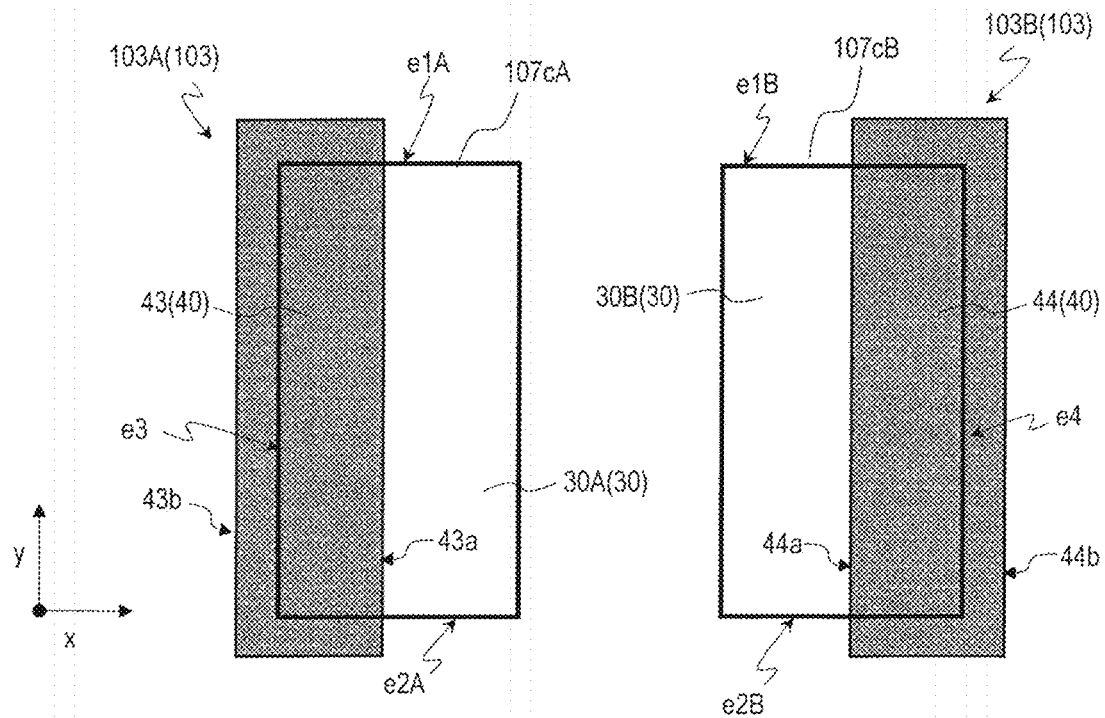
FIG. 10B is a plan view illustrating still another example of an arrangement relationship between the light blocking layer 103 and the channel region 107c.

FIGS. 10A and 10B are plan views each illustrating still another example of an arrangement relationship between the channel region 107c and the light blocking layer 103 in the first TFT 101.

As illustrated in FIG. 10A, the first layer 103A of the light blocking layer 103 may include only the first light blocking portion 41, and the second layer 103B may include only the second light blocking portion 42. In this case, when viewed from the normal direction of the substrate 1, the opening region 30 of the light blocking layer 103 includes the region 30A corresponding to a portion of the first channel portion 107cA not overlapping the first light blocking portion 41, and the region 30B corresponding to a portion of the second channel portion 107cB not overlapping the second light blocking portion 42.

Alternatively, as illustrated in FIG. 10B, the first layer 103A of the light blocking layer 103 may include only the third light blocking portion 43, and the second layer 103B may include only the fourth light blocking portion 44. In this case, when viewed from the normal direction of the substrate 1, the opening region 30 of the light blocking layer 103 includes the region 30A corresponding to a portion of the first channel portion 107cA not overlapping the third light blocking portion 43, and the region 30B corresponding to a portion of the second channel portion 107cB not overlapping the fourth light blocking portion 44.

The structure of the light blocking layer 103 in the present embodiment is not limited to the structure described above with reference to FIGS. 2A to 10B. It is sufficient for the light blocking layer 103 to include at least one set of light blocking portions in a relationship in which changes in areas of the light-blocked portion P1 due to the alignment shift are compensated. In other words, it is sufficient to include (i) the first light blocking portion 41 and second light blocking portion 42, (ii) the third light blocking portion 43 and fourth light blocking portion 44, or both (i) and (ii). This makes it possible to suppress the change in the light blocking ratio AR due to the alignment shift along the y direction, the x direction, or both of these directions. In a case where the above-exemplified light blocking layer 103 includes only one of the first light blocking portion 41 and the second light blocking portion 42, the light blocking ratio AR may change depending on the direction in which the alignment shift is generated. Because of this, it is preferable for the light blocking layer 103 to include both the first light blocking portion 41 and the second light blocking portion 42, or include none of them. Likewise, it is preferable for the light blocking layer 103 to include both the third light blocking portion 43 and the fourth light blocking portion 44, or include none of them.

Although, in FIGS. 2A to 6, an example in which the channel region 107c has a rectangular planar shape longer in size in the y direction is represented, the shape of the channel region 107c is not limited thereto. For example, the channel region 107c may have a rectangular planar shape longer in size in the x direction.

Evaluation of TFT Characteristics

A relationship between the light blocking ratio AR and the shift amount of the threshold voltage Vth has been studied, and the result thereof is described below.

First, three sample TFTs, that is, sample TFT 1, sample TFT 2, and sample TFT 3 having mutually different light blocking ratios AR were produced.

Figure 21A:
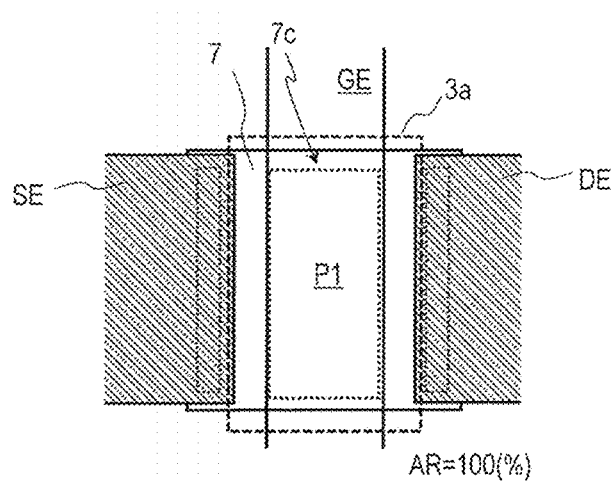
FIG. 21A is a plan view illustrating sample TFT 1 having a second light blocking structure.
Figure 21B:
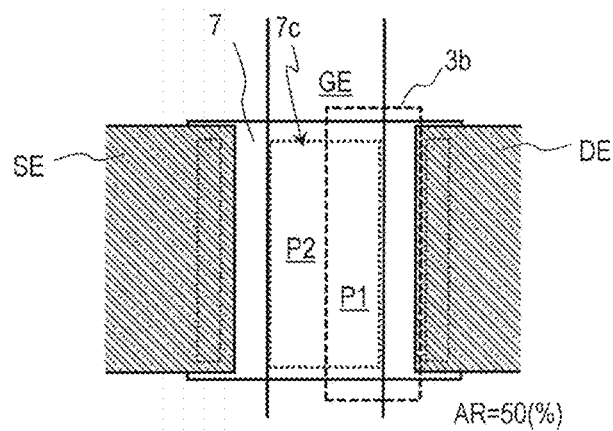
FIG. 21B is a plan view illustrating sample TFT 2 having a first light blocking structure.
Figure 21C:
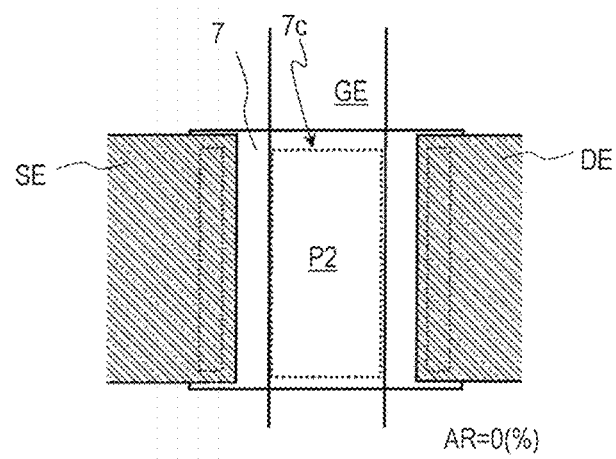
FIG. 21C is a plan view illustrating sample TFT 3 including no light blocking layer.

FIGS. 21A to 21C are plan views illustrating sample TFT 1 to sample TFT 3, respectively. As illustrated in FIG. 21A, the sample TFT 1 includes an oxide semiconductor layer 7 having a channel region 7c, a source electrode SE, a drain electrode DE, a gate electrode GE, and a light blocking layer 3a. In the sample TFT 1, the light blocking layer 3a is disposed to shield the overall channel region 7c from light (referred to as a "second light blocking structure"). Therefore, the light blocking ratio AR with respect to the channel region 7c of the sample TFT 1 is 100%. The sample TFT 2 illustrated in FIG. 21B has a first light blocking structure in which the channel region 7c is partially shielded from light. In the sample TFT 2, a light blocking layer 3b is disposed to cover only the drain side of the channel region 7c when viewed from the normal direction of the substrate 1 so that the light blocking ratio AR is 50%. The sample TFT 3 illustrated in FIG. 21C differs from the other sample TFTs in that the sample TFT 3 is not provided with a light blocking layer (that is, the light blocking ratio AR is 0%).

Next, a gate voltage Vg of +30 V was applied to each of the three sample TFTs in a state in which each sample TFT was irradiated with backlight light (luminous intensity: 4500 cd) from the back surface. Current-voltage characteristics of each sample TFT were measured at a measurement temperature of 60° C. and a Vg stress application time being from 0 to 3600 seconds.

The measurement results of the threshold voltages of the sample TFTs at the Vg stress application time being 3600 seconds are shown in Table 1.

TABLE 1

| | Light Blocking Ratio AR | Threshold Voltage Vth |
|---|---|---|
| Sample TFT 1 | 100% | 8.12 V |
| Sample TFT 2 | 50% | 7.72 V |
| Sample TFT 3 | 0% | 4.81 V |

From the results shown in Table 1, it is understood that, as the light blocking ratio AR increases, the shift amount of the threshold voltage in the positive direction increases. The reason for this is thought to be as follows: as the light blocking area is decreased in the channel region, in other words, as the amount of light allowed to enter the channel region is increased, the shift amount of the threshold voltage Vth in the negative direction due to photodegradation is increased, which compensates for the positive shift of the threshold voltage, so that the positive shift thereof is suppressed. Accordingly, it is understood that the desired TFT characteristics may be achieved by adjusting the light blocking ratio AR of the TFT in accordance with the characteristics required for the TFT. The positive shift of the threshold voltage may be controlled by the light blocking ratio AR regardless of the planar shape of the light blocking layer. Accordingly, the same effects as those described above may be obtained even when, for example, a light blocking layer having various planar shapes in consideration of alignment is used in the first TFT.

Application Example 1 to Active Matrix Substrate: SSD Circuit

The first TFT may be applied to a circuit TFT of an active matrix substrate. The first TFT may be suitably used for an SSD circuit, for example. Since a control signal is applied to the SSD circuit TFT at a relatively high duty ratio, the shift amount of the threshold voltage in the positive direction is likely to increase. By applying the first light blocking structure to such TFT, the shift amount of the threshold voltage in the positive direction may be decreased by making use of the negative shift of the threshold voltage brought by photodegradation.

First, an example of a configuration of an SSD circuit will be described with reference to the accompanying drawings.

Figure 11:
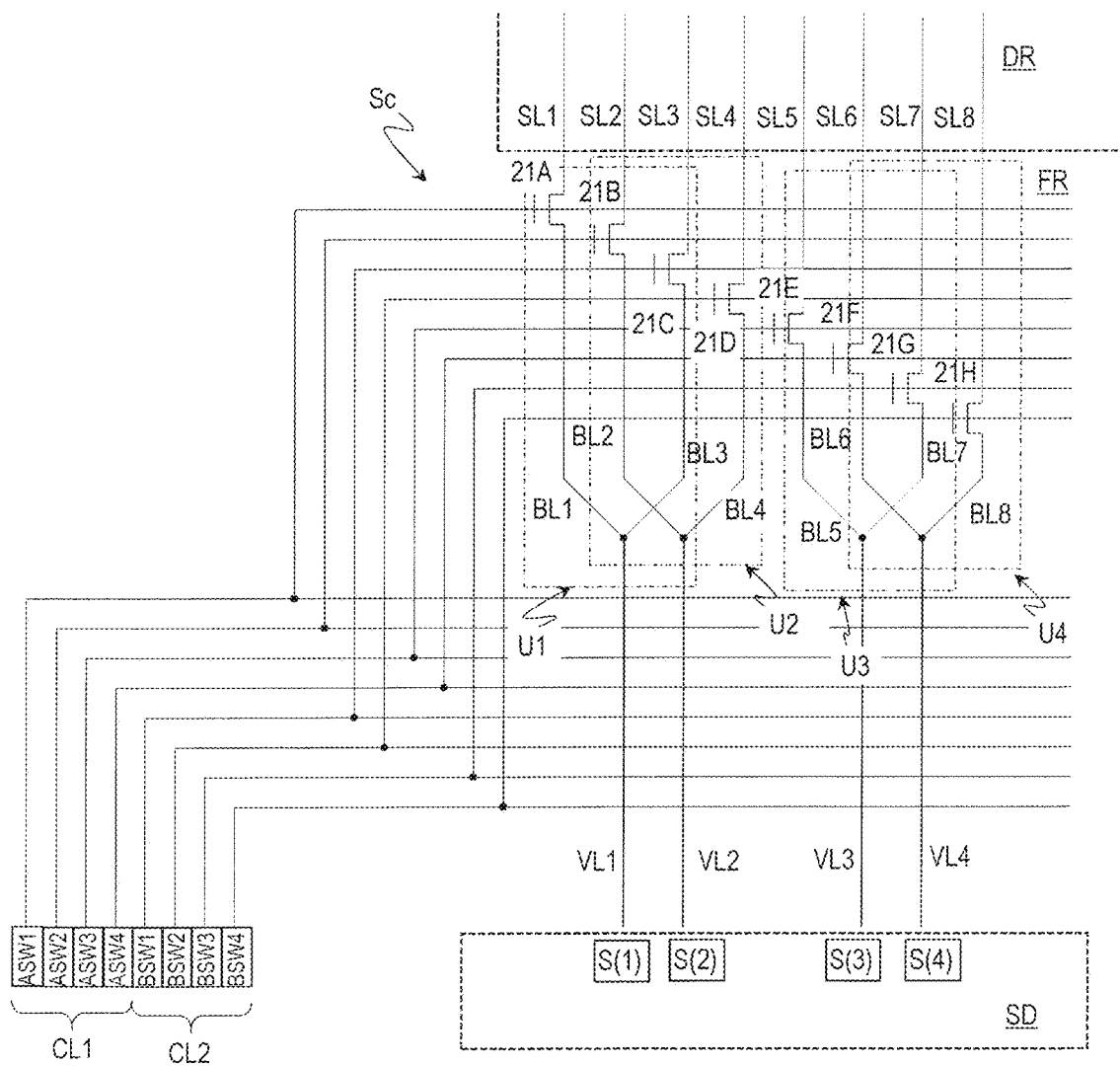
FIG. 11 is a diagram for explaining a configuration and action of an SSD circuit Sc.

FIG. 11 is a diagram for explaining a configuration and action of the SSD circuit Sc in the active matrix substrate 1001 of the present embodiment.

The SSD circuit Sc is disposed between the source driver SD and the display region DR. The SSD circuit Sc includes a plurality of SSD circuit TFTs 21A to 21H (hereinafter collectively referred to as "TFTs 21"). The TFTs 21 are each the first TFT having the first light blocking structure.

The SSD circuit Sc includes a plurality of unit circuits U supported by the substrate 1. Each of the plurality of unit circuits U distributes a display signal from one signal output line VL to n source bus lines SL (n is an integer of not less than two). FIG. 11 illustrates a case in which, when n equals two, that is, when each unit circuit U distributes a display signal from one signal output line VL to two source bus lines SL. Although the SSD circuit includes a large number of unit circuits, only four unit circuits (a first unit circuit U1 to a fourth unit circuit U4) are illustrated in FIG. 11 for simplicity.

Each unit circuit U includes n (two in this case) branch wiring lines BL, and n (two in this case) SSD circuit TFTs 21 (TFTs 21A and 21C in the first unit circuit U1). Two branch wiring lines BL are connected to one signal output line VL. Two TFTs 21 are respectively connected to two branch wiring lines BL. These TFTs 21 control the turning on/off of the electrical connections between two branch lines BL and two source bus lines SL individually (independently).

Hereinafter, the configuration of each unit circuit U will be described more specifically taking the first unit circuit U1 and the second unit circuit U2 as an example.

The first unit circuit U1 distributes a display signal S(1) from the signal output line VL1 to the source bus lines SL1 and SL3, and the second unit circuit U2 distributes a display signal S(2) from the signal output line VL2 to the source bus lines SL2 and SL4.

The TFT 21A as one TFT of the first unit circuit U1 controls the turning on/off of the electrical connection between a branch wiring line BL1 and the source bus line SL1, and the TFT 21C as the other TFT thereof controls the turning on/off of the electrical connection between a branch wiring line BL3 and the source bus line SL3. The source electrode and the drain electrode of the TFT 21A are connected to the branch wiring line BL1 and the source bus line SL1, respectively, and the source electrode and the drain electrode of the TFT 21C are connected to the branch wiring line BL3 and the source bus line SL3, respectively.

The TFT 21B as one TFT of the second unit circuit U2 controls the turning on/off of the electrical connection between a branch wiring line BL2 and the source bus line SL2, and the TFT 21D as the other TFT thereof controls the turning on/off of the electrical connection between a branch wiring line BL4 and the source bus line SL4. The source electrode and the drain electrode of the TFT 21B are connected to the branch wiring line BL2 and the source bus line SL2, respectively, and the source electrode and the drain electrode of the TFT 21D are connected to the branch wiring line BL4 and the source bus line SL4, respectively.

The SSD circuit Sc also includes n (two in this case) control signal trunk lines CL1 and CL2.

In the first unit circuit U1, the gate electrode of the TFT 21A is supplied with a selection signal (SSD control signal) ASW1 from the control signal trunk line (first control signal trunk line) CL1, and the gate electrode of the TFT 21C is supplied with a selection signal (SSD control signal) BSW1 with a phase opposite to that of the selection signal ASW1 from the control signal trunk line (second control signal trunk line) CL2. In the second unit circuit U2, the gate electrode of the TFT 21B is supplied with a selection signal ASW2 from the first control signal trunk line CL1, and the gate electrode of the TFT 21D is supplied with a selection signal BSW2 from the second control signal trunk line CL2. These selection signals define on-periods of the selection switches within the same group and are synchronized with the time-sequential signals output from the source driver SD. Each unit circuit U writes a data potential obtained by time-dividing the output of the signal output line VL to the corresponding two source bus lines SL time-sequentially (time division driving).

Figure 12:
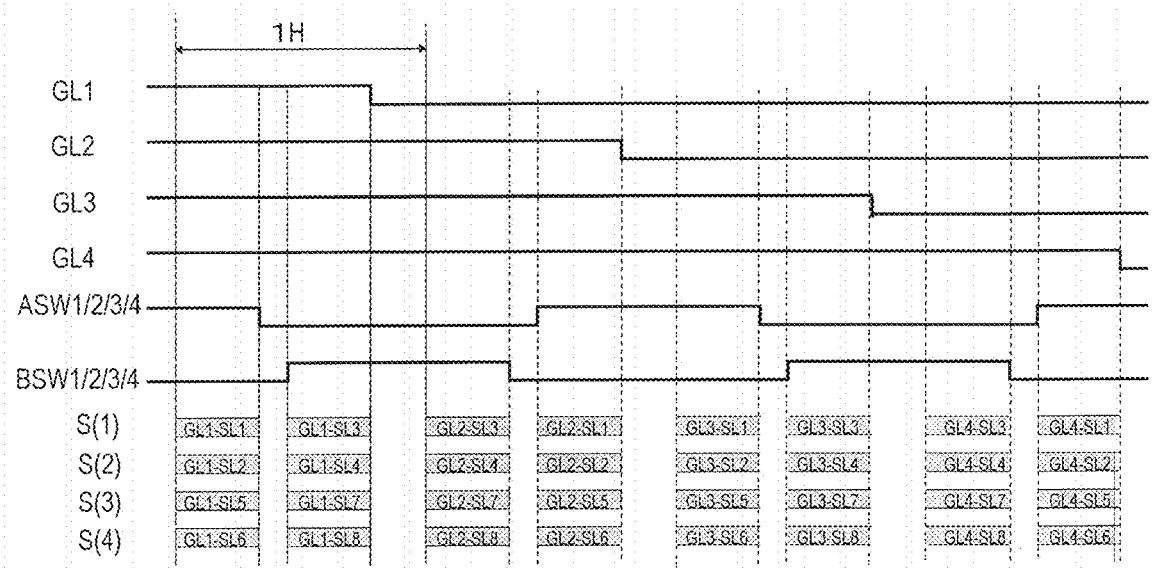
FIG. 12 is a diagram exemplifying a timing chart of the SSD circuit Sc.

FIG. 12 is a timing chart depicting the action of the SSD circuit Sc. As depicted in the drawing, in the first horizontal scan period 1H, the uppermost gate bus line GL1 is selected. In the horizontal scan period 1H, by sequentially turning on the selection signals ASW1 and BSW1, and sequentially selecting two TFTs, which are the TFTs 21A and 21C, in the first unit circuit U1, the signal output line VL1 is sequentially output with data potentials for two pixels located at the intersection portions of the gate bus line GL1 and the source bus lines SL1 and SL3. Similarly, the signal output line VL2 is sequentially output with data potentials for two pixels located at the intersection portions of the gate bus line GL1 and the source bus lines SL2 and SL4. This similarly applies to other signal wiring lines. The selection signals ASW1 to ASW4 are supplied by the common first control signal trunk line CL1, and the selection signals BSW1 to BSW4 are supplied by the common second control signal trunk line CL2.

The gate electrodes of two TFTs 21 in each unit circuit U are respectively connected to the first control signal trunk line CL1 and the second control signal trunk line CL2, and thus a predetermined voltage is applied at a high duty ratio of approximately 50%. Due to this, these TFTs 21 are likely to exhibit characteristics in which the threshold voltages shift in the positive direction accompanying the action thereof. However, in the present embodiment, each TFT 21 has the first light blocking structure. Because of this, during the action of the active matrix substrate, backlight light may be incident on the oxide semiconductor layer of each TFT 21 from the substrate 1 side, and a negative shift of the threshold voltage may occur due to the light. As a result, some or all of the shift amount of the threshold voltage of the TFT 21 in the positive direction is canceled out, and thus the change in the TFT characteristics may be suppressed.

The SSD circuit of the present embodiment is not limited to the above-exemplified configuration, and may have various configurations. For example, each unit circuit U may be disposed for three source bus lines SL associated with R, G, and B pixels (that is, n=3). In this case, a predetermined voltage is applied to the gate electrodes of three TFTs 21 in each unit circuit U at a high duty ratio of approximately 33%. Due to this, a positive shift of the threshold voltage is likely to be generated, but as in the above example, the shift amount of the threshold voltage may be reduced by intentionally causing light to be incident on the oxide semiconductor layer of the TFT 21.

Figure 13:
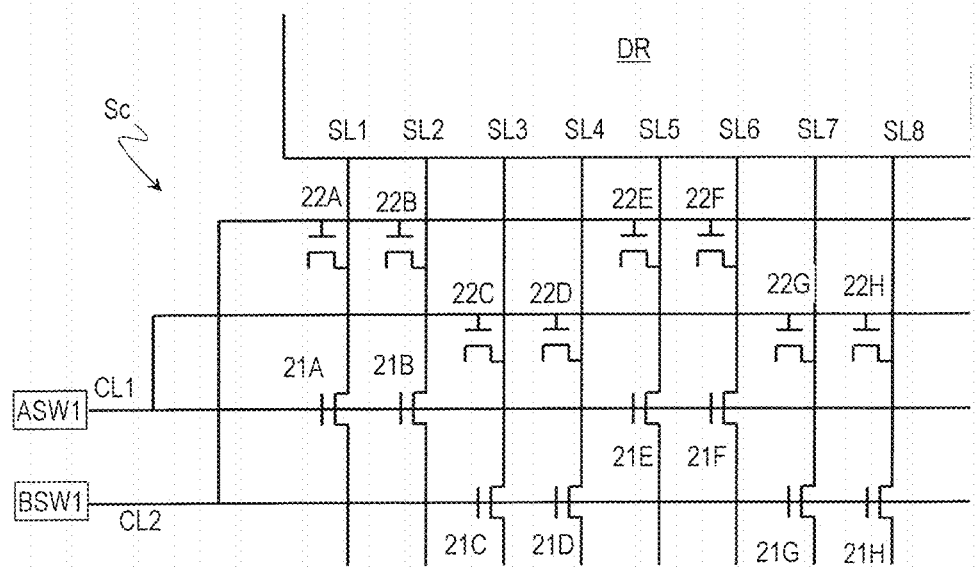
FIG. 13 is a diagram illustrating part of another SSD circuit.

The SSD circuit may include a plurality of compensation TFTs, which are referred to as cancellation elements. FIG. 13 is a diagram illustrating part of an SSD circuit including cancellation elements.

A plurality of compensation TFTs 22A to 22H (hereinafter, collectively referred to as "compensation TFTs 22" in some cases) are associated with the plurality of source bus lines SL. The source of the compensation TFT 22 is connected between the SSD circuit TFT 21 in the corresponding source bus line SL and the display region DR. The drain side of the compensation TFT 22 may be electrically floating or may be connected to a wiring line that supplies a common potential (COM). The gate of the compensation TFT 22 is supplied with a signal having a phase opposite to that of the SSD control signal ASW supplied to the gate of the corresponding SSD circuit TFT 21 (hereinafter referred to as an "inversion signal"). For example, the control signal ASW1 may be supplied from the control signal trunk line CL1 to the gate of the SSD circuit TFT 21A, and the control signal BSW1, whose phase is opposite to the phase of the control signal AWS1, may be supplied from the control signal trunk line CL2 to the gate of the compensation TFT 22A as an inversion signal.

In the present example, the control signal trunk lines CL1 and CL2, whose signal phases are opposite to each other, are used to supply the inversion signal, but a wiring line configured to supply the inversion signal may be provided separately. By providing the compensation TFTs 22, it is possible to compensate for a video signal fluctuation (sinking) in the source bus line SL, which occurs when the SSD circuit TFT 21 is switched from ON to OFF.

For reference in the present specification, as for the action, the timing chart of the time division driving, and the like of the display device using the SSD circuit Sc, the entire contents of the disclosure of JP 2008-225036 A, JP 2006-119404 A, and WO 2011/118079 are incorporated herein by reference. Further, for reference, as for the SSD circuit including the cancellation elements (compensation TFTs), the entire contents of the disclosure of JP 5-232508 A are incorporated herein by reference, for example.

Application Example 2 to Active Matrix Substrate: First TFT Formation Position in Non-Display Region The active matrix substrate 1001 may be applied to various display devices such as a liquid crystal display device. The display device includes the active matrix substrate 1001, a counter substrate equipped with a color filter, a black matrix and the like, and a display panel including a light modulation layer (for example, a liquid crystal layer) disposed between the active matrix substrate 1001 and the counter substrate. The display device further includes a backlight disposed on a back face side of the display panel (the opposite side to the liquid crystal layer of the active matrix substrate 1001). The backlight is disposed such that light emitted from the backlight (backlight light) is incident on the display region of the active matrix substrate 1001. On the other hand, light that travels from the backlight toward the non-display region is blocked by a frame support portion configured to hold the backlight and the display panel, and the like. However, some of the light from the backlight may be incident on a region of the non-display region near the display region. For example, part of the backlight light having been incident on the display region is incident on the non-display region by reflection, scattering, or the like within the active matrix substrate. Accordingly, in the non-display region, the amount of irradiation by the backlight light tends to increase at a position closer to the display region, and the amount of irradiation tends to decrease at a position distanced farther from the display region.

In the present embodiment, at least some of the circuit TFTs formed in the non-display region are the first TFTs having the first light blocking structure. In this case, in order to obtain the effect of the first light blocking structure (the effect of reducing the shift amount of the threshold voltage), it is preferable for the first TFT to be formed in a region of the non-display region where the amount of irradiation by the backlight light is relatively large. In other words, in the non-display region, the first TFT is preferably formed at a position as close as possible to the display region. In the non-display region, no other TFT may be disposed between the TFT formation region in which the first TFT is formed and the display region.

Hereinafter, an example of a case in which the first TFT is applied to the SSD circuit TFT described above is given to describe the formation region of the first TFT.

In general, an SSD circuit is provided between a display region and a terminal section formation region in which source terminals for connecting to a source driver are formed. In the present embodiment, no other TFT (for example, a cancellation element) is provided between the SSD circuit TFT and the display region. As a result, the amount of light allowed to be incident on the SSD circuit TFT may be increased. Hereinafter, this will be described with reference to the accompanying drawings.

Figure 14:
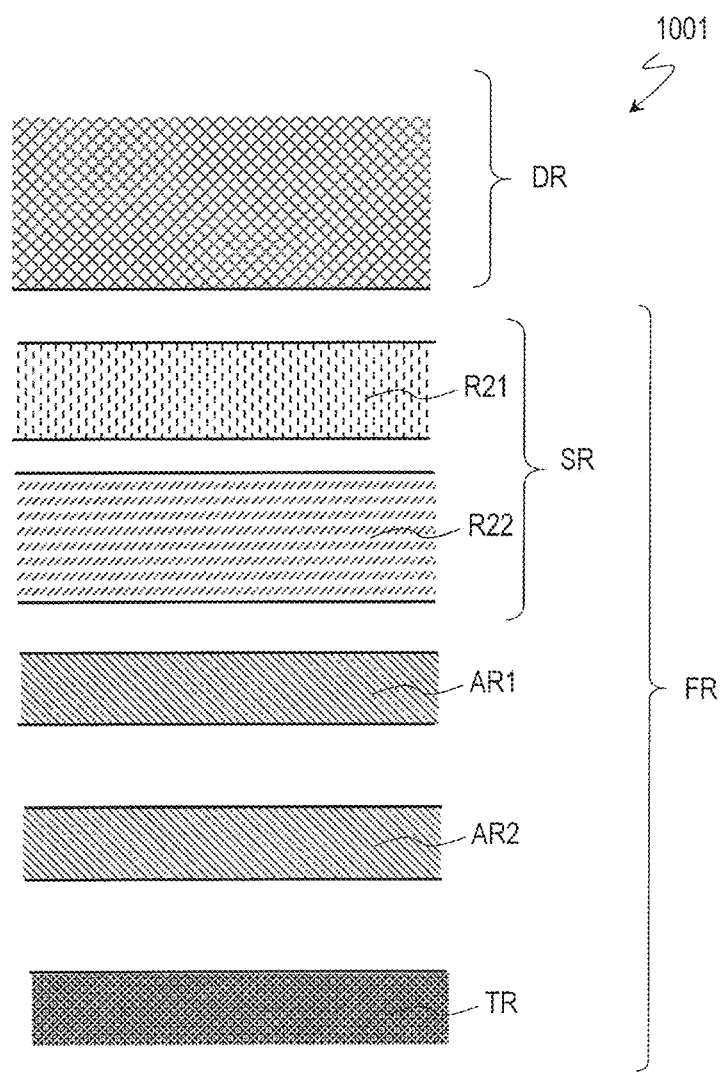
FIG. 14 is a plan view illustrating part of the active matrix substrate 1001, and is also a diagram indicating a position of a TFT formation region located between an edge portion of a display region and a terminal section formation region in which source terminals are formed.
Figure 15:
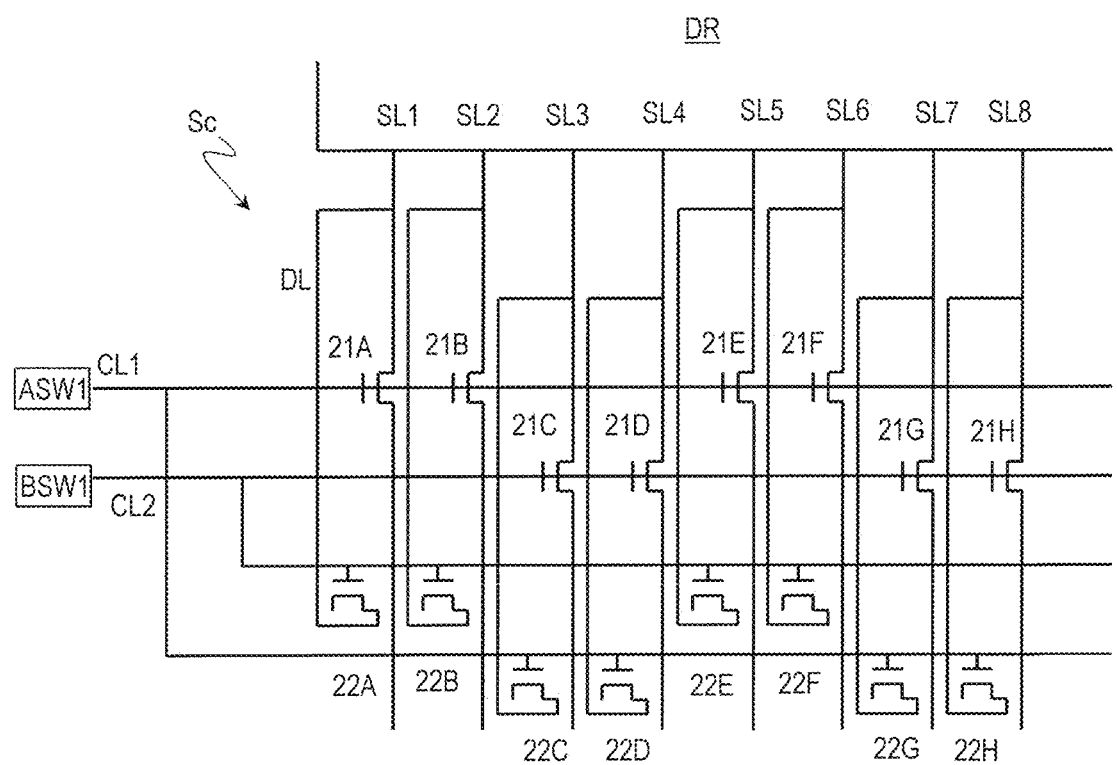
FIG. 15 is a diagram exemplifying a configuration of an SSD circuit illustrated in FIG. 14.
Figure 20:
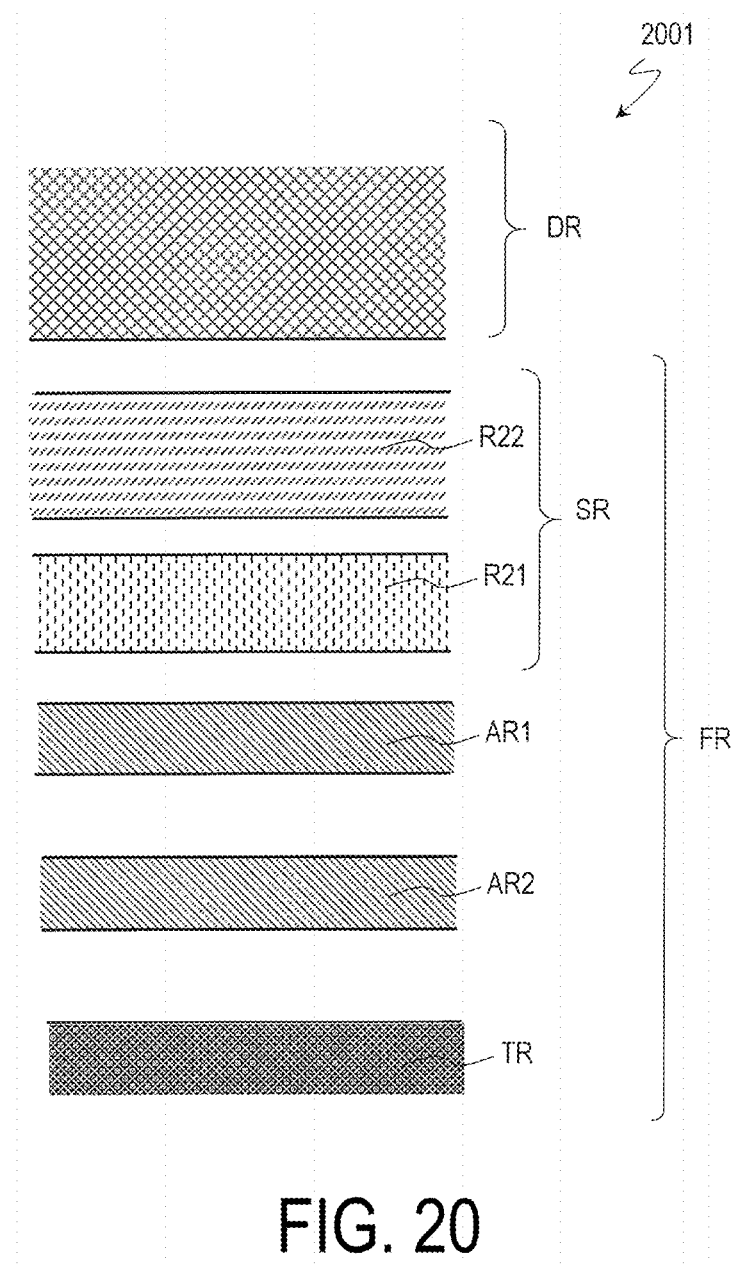
FIG. 20 is a plan view illustrating part of an active matrix substrate 2001 of a reference example, and is also a diagram indicating a position of a TFT formation region located between an edge portion of a display region and a terminal section formation region in which source terminals are formed.

FIG. 14 is a plan view illustrating part of the active matrix substrate of the present embodiment, in which the arrangement of TFTs located between an edge portion of the display region and the terminal section formation region in which the source terminals are formed. FIG. 15 is a diagram exemplifying a configuration of an SSD circuit illustrated in FIG. 14. For comparison, the arrangement of TFTs in an active matrix substrate 2001 of a reference example is illustrated in FIG. 20.

As illustrated in FIG. 14, a region where the SSD circuit is disposed (hereinafter, referred to as a "circuit formation region SR") is arranged between the display region DR and the terminal section formation region TR. A lighting-inspection TFT formation region AR1, in which a TFT (ASL transistor) used for panel lighting inspection is formed, is arranged between the circuit formation region SR and the terminal section formation region TR, for example. When the display panel is an in-cell touch panel, a touch panel lighting-inspection TFT formation region AR2, in which a TFT (TP-ASL transistor) used in panel lighting inspection for the touch panel is formed, may be arranged between the lighting-inspection TFT formation region AR1 and the terminal section formation region TR. These lighting-inspection TFTs may be, for example, top gate structure oxide semiconductor TFTs. The light blocking structure of these TFTs is not limited to any specific structure. The lighting-inspection TFT may not include a light blocking layer.

The circuit formation region SR includes an SSD circuit TFT formation region R21, in which the plurality of SSD circuit TFTs (first TFTs) are formed. In a case where the SSD circuit includes the compensation TFT (cancellation element) described above, the circuit formation region SR further includes a compensation TFT formation region R22, in which the plurality of compensation TFTs are formed. In the present embodiment, the SSD circuit TFT formation region R21 is arranged on the display region DR side relative to the compensation TFT formation region R22. The compensation TFT may be, for example, a top gate structure oxide semiconductor TFT. Since the compensation TFT is a TFT to perform raising and lowering by coupling when an inversion signal is input, it is sufficient that the compensation TFT have capacitance. Accordingly, in the compensation TFT, a positive shift of the threshold voltage is not particularly problematic, so that the light blocking structure of the compensation TFT is not particularly limited. The compensation TFT may not have a light blocking layer.

The source of the compensation TFT is connected between the display region DR in the source bus line SL and the SSD circuit TFT, and therefore a layout is generally adopted in which the compensation TFTs are disposed on the display region DR side relative to the SSD circuit TFTs. In other words, like a reference example illustrated in FIG. 20, the compensation TFT formation region R22 is arranged on the display region DR side relative to the SSD circuit TFT formation region R21. As a result, the SSD circuit TFT formation region R21 is located farther from the display region DR, so that a sufficient amount of light may not enter the SSD circuit TFT formation region R21.

In contrast, in the present embodiment, the SSD circuit TFT formation region R21 is arranged on the display region DR side relative to the compensation TFT formation region R22. Any other TFT is not provided on the display region DR side relative to the SSD circuit TFT formation region R21. This makes it possible to cause a larger amount of light to enter the SSD circuit TFT formation region R21. Thus, by causing a predetermined amount of light to enter the channel region of the SSD circuit TFT, the positive shift of the threshold voltage may be more effectively suppressed.

Application Example 3 to Active Matrix Substrate

The active matrix substrate 1001 may include the plurality of first TFTs described above and a plurality of second TFTs having a light blocking structure different from the light blocking structure of the first TFTs (first light blocking structure).

In the second TFT, when viewed from the normal direction of the substrate, the light blocking layer may be disposed to overlap the entire channel region of the oxide semiconductor layer (second light blocking structure).

The plurality of first TFTs may include the SSD circuit TFTs and the circuit TFTs such as the gate driver circuit TFT. The plurality of second TFTs may include, for example, pixel TFTs provided in the display region. An off-leak current is required to be small for the pixel TFT. This is because, when the off-leak current is large, retention characteristics of a potential having been written to a pixel electrode deteriorate, which may cause display defects such as luminance unevenness and a flicker. By the pixel TFT having the second light blocking structure, the negative shift of the threshold voltage due to photodegradation may be suppressed, and thus an increase in the off-leak current may be suppressed. The second TFT may further include part of the circuit TFTs.

Hereinafter, the structure of the second TFT will be specifically described while taking the pixel TFT as an example with reference to the accompanying drawings. The first TFT has been described earlier with reference to FIGS. 2A to 10B, and therefore description thereof will be omitted. The description is given below in which an active matrix substrate applied to an FFS mode display device is taken as an example. The FFS mode is a mode of a lateral electric field scheme in which a pair of electrodes is provided in one of substrates, and an electrical field is applied to liquid crystal molecules in a direction (lateral direction) parallel to a substrate plane. The active matrix substrate of the present embodiment may be applied to a display device of a longitudinal electric field scheme mode (for example, a TN mode or a vertical orientation mode) in which a voltage is applied in a thickness direction of the liquid crystal layer.

Figure 16:
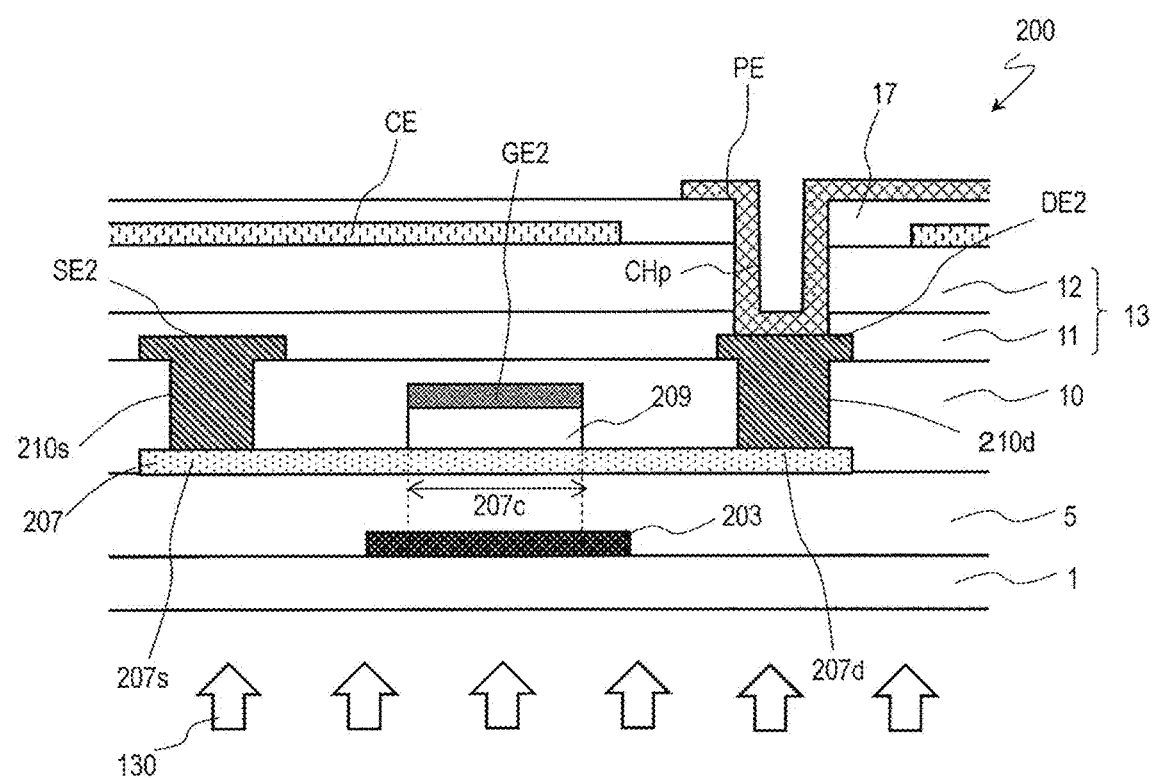
FIG. 16 is a schematic cross-sectional view exemplifying a second TFT 200 in the active matrix substrate 1001.

FIG. 16 is a cross-sectional view exemplifying a second TFT 200.

The second TFT 200 is supported by the substrate 1. The second TFT 200 is a pixel TFT disposed in each pixel area PIX in the display region DR.

The second TFT 200 is formed using the same oxide semiconductor film as that of the first TFT. Electrodes of the second TFT 200 may be provided in the same metal layer as that of the first TFT. In this example, the TFT structure other than a light blocking layer in the second TFT 200 is the same as that of the first TFT. The following description mainly describes differences from the first TFT.

The second TFT 200 includes a light blocking layer 203 disposed on the substrate 1, an oxide semiconductor layer 207 disposed on the light blocking layer 203 with the lower insulating layer 5 interposed therebetween, a gate insulating layer 209 disposed on the oxide semiconductor layer 207, a gate electrode GE2 disposed on the gate insulating layer 209, a source electrode SE2, and a drain electrode DE2.

Similar to the oxide semiconductor layer of the first TFT, the oxide semiconductor layer 207 includes a channel region 207c overlapping with the gate electrode GE2, a source contact region 207s, and a drain contact region 207d, when viewed from the normal direction of the main surface of the substrate 1. The source contact region 207s is electrically connected to the corresponding source bus line SL via the source electrode SE2. The drain contact region 207d is electrically connected to a pixel electrode PE via the drain electrode DE2.

The light blocking layer 203 is disposed to overlap the entire channel region 207c when viewed from the normal direction of the substrate 1. With this, the deterioration in characteristics of the oxide semiconductor layer 207 caused by light (backlight light) 130 from the substrate 1 side may be more effectively suppressed. When viewed from the normal direction of the substrate 1, the light blocking layer 203 may be disposed to overlap the entire oxide semiconductor layer 207, or overlap the entirety of a portion of the oxide semiconductor layer 207 located between the source contact region 207s and the drain contact region 207d.

The gate electrode GE2 may be formed integrally with (may be connected to) the gate bus line GL. For example, the gate electrode GE2 may be part of the gate bus line GL. In this case, a portion of the gate bus line GL overlapping the oxide semiconductor layer 207 when viewed from the normal direction of the substrate 1, may be referred to as the "gate electrode GE2".

The source electrode SE2 may be integrally formed with (may be connected to) the source bus line SL. For example, the source electrode SE2 may be part of the source bus line SL. In this case, a portion of the source bus line SL connected to the oxide semiconductor layer 207 may be referred to as the "source electrode SE2".

An upper insulating layer 13 is formed on the source metal layer to cover the second TFT 200. The upper insulating layer 13 includes an inorganic insulating layer (for example, a passivation film) 11, for example. As illustrated in the drawing, the upper insulating layer 13 may have a layered structure including the inorganic insulating layer 11 and an organic insulating layer 12 formed on the inorganic insulating layer 11. The organic insulating layer 12 may not be formed. Alternatively, the organic insulating layer 12 may be formed only in the display region.

The common electrode CE is formed on the upper insulating layer 13. The common electrode CE need not necessarily be separated for each pixel area PIX. For example, the common electrode CE may have an opening in a pixel contact region (a region in which a pixel contact hole CHp is formed) for connecting the pixel electrode PE and the drain electrode DE, and may be formed across the entire pixel area PIX except the pixel contact region.

The pixel electrode PE is disposed on the common electrode CE with the dielectric layer 17 interposed therebetween. The pixel electrodes PE are separated for each pixel area PIX. In each pixel area PIX, in the pixel electrode PE, one or a plurality of slits (openings) or notched portions are provided.

The pixel electrode PE is disposed on the dielectric layer 17 and is connected to the drain electrode DE2 within the pixel contact hole CHp formed in the upper insulating layer 13 and the dielectric layer 17.

In the illustrated example, the pixel electrode PE is formed on the common electrode CE with the dielectric layer 17 interposed therebetween, but the common electrode CE may be formed on the pixel electrode PE with the dielectric layer 17 interposed therebetween. In this case, in each pixel area PIX, a slit or a notched portion is provided in the common electrode CE.

The second TFT 200 may not include a drain electrode. In this case, the pixel electrode PE may be directly connected to the drain contact region 207d of the oxide semiconductor layer 207.

Furthermore, although not illustrated, the source bus line SL and the source electrode SE2 of the second TFT 200 may be formed using the same conductive film as that of the light blocking layer 203. As discussed above, a substrate structure in which the source bus line SL is disposed on the substrate 1 side relative to the gate metal layer and the oxide semiconductor layer 207 is referred to as a "lower source structure".

Application Example 4 to Active Matrix Substrate: Gate Driver

The first TFT may be used, for example, in the gate driver. As describe earlier, a relatively large positive shift may occur in the threshold voltage in some of the gate driver circuit TFTs (for example, an output transistor). By applying the first light blocking structure to these TFTs and intentionally causing light to be incident on the oxide semiconductor layer, the shift amount of the threshold voltage may be reduced.

Configuration of Gate Driver

An example of the configuration of the gate driver GD monolithically formed in the active matrix substrate 1001 will be described.

The gate driver GD is constituted of a shift register including a plurality of stages. Each stage of the shift register is provided to correspond to one pixel row (multiple pixel rows in a case of double-gate driving) to which the shift register corresponds in the display region. Each stage of the shift register is set to be in one of two states at each time point, and serves as a bistable circuit configured to output a signal indicating the above state (hereinafter referred to as a "state signal"). The state signal output from each stage of the shift register is supplied as a scanning signal to the corresponding gate bus line.

In this example, each bistable circuit is provided with a first clock CKA, a fourth clock CKD, a clear signal CLR, a reference potential VSS, an input terminal for receiving a set signal S and a reset signal R, and an output terminal for outputting a state signal Q. A state signal Q output from the second preceding stage is supplied as a set signal S, and a state signal Q output from the third subsequent stage is supplied as a reset signal R. In other words, with reference to the k-th stage, a scanning signal Gout(k−2) supplied to the gate bus line of the (k−2)th row is supplied as a set signal S, and a scanning signal Gout(k+3) supplied to the gate bus line of the (k+3)th row is supplied as a reset signal R. A gate start pulse signal GSP is supplied as a set signal S to the bistable circuits of the first stage and the second stage of the shift register. The clear signal CLR is supplied as a reset signal R to the bistable circuits of the last three stages of the shift register. Of the bistable circuits, the first stage and the last three stages are dummy circuits, and the circuits from the second stage to the (1+x)th stage (k=2 to 1+x) are connected to the gate bus lines GL1 to GLx, respectively.

In the above-described configuration, when a pulse of the gate start pulse signal GSP is supplied as the set signal S to the first stage of the shift register, the pulse included in the gate start pulse signal GSP (this pulse is included in the state signal Q output from each stage) is sequentially transferred from the first stage to the last stage based on each clock signal. In response to the transfer of the pulse, the state signal Q output from each stage is sequentially set to a high level. Then, the state signal Q output from each stage is supplied to each gate bus line GL as a scanning signal Gout(k).

Figure 17:
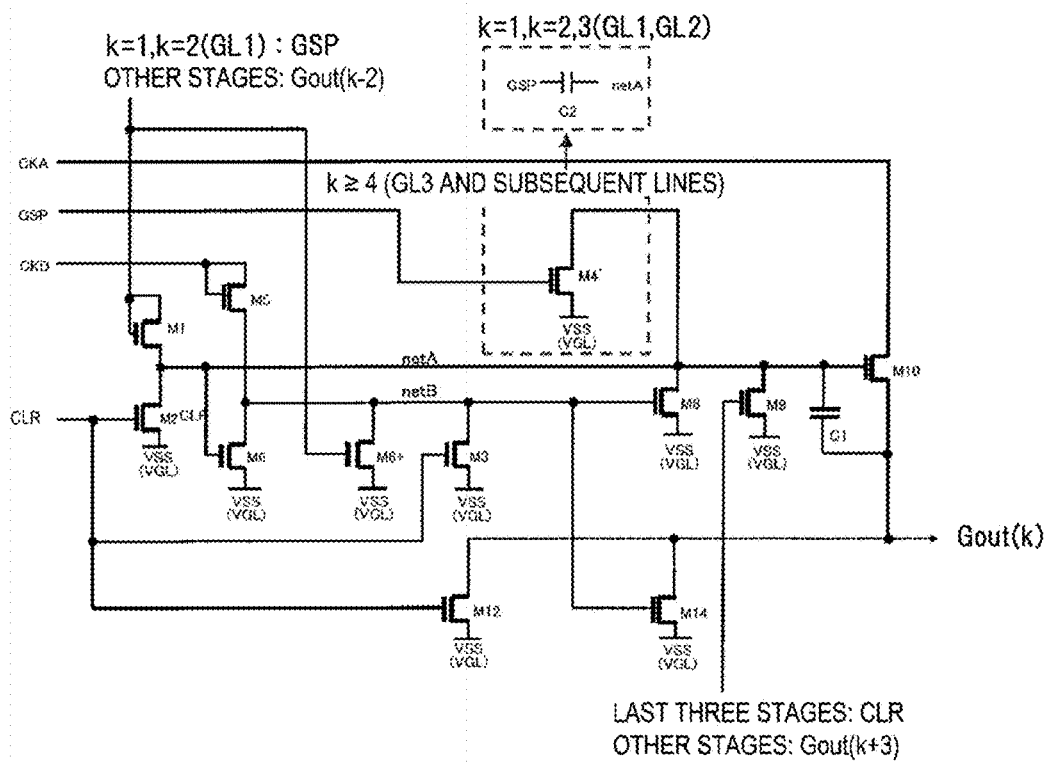
FIG. 17 is a circuit diagram illustrating a configuration of a bistable circuit SRk included in a shift register (illustrating a configuration of the k-th stage of the shift register).

FIG. 17 is a circuit diagram illustrating a configuration of a bistable circuit SRk included in the shift register (illustrating a configuration of the k-th stage of the shift register). As illustrated in the drawing, the bistable circuit SRk is provided with a plurality (12 in this case) of TFTs and a capacitor C1. The plurality of TFTs include transistors M2, M3 and M12 (also referred to as clear transistors), to the gate electrodes of which the clear signal CLR is input, a transistor M10 (also referred to as an output transistor) configured to output the output signal Gout(k), a transistor M1, to the gate and drain electrodes of which the set signal (Gout(k−2) or GSP when k=1, k=2) is input (that is, a diode-connected transistor), and a transistor M8 (also referred to as a pull-down transistor), the source or drain electrode of which is electrically connected to the gate electrode of the output transistor M10. A node connected to the gate electrode of the transistor M10 is referred to as a netA, and a node connected to the gate electrode of the transistor M8 is referred to as a netB. The source electrode of the transistor M1 is connected to the netA. The bistable circuit SRk also includes the transistors M3, M6, and M6+ with the drain electrodes connected to the netB.

Figure 18:
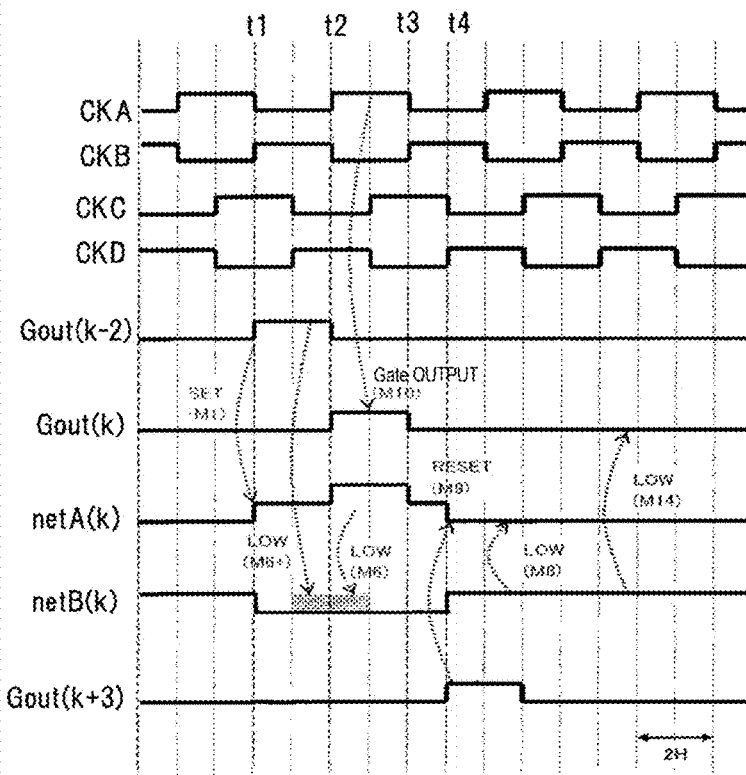
FIG. 18 is a timing chart of each bistable circuit of the shift register.

FIG. 18 is a timing chart of each bistable circuit of the shift register. At time point t1, the transistor M1 is supplied with a pulse of Gout(k−2) as a set signal. With this, the potential of the netA changes from a low level to a high level. When the transistor M6+ is turned on, the potential of the netB is set to a low level.

At time point t2, the first clock CKA changes from a low level to a high level. This increases the potential of the netA. As a result, the potential of the scanning signal Gout(k) increases to the high level potential of the first clock CKA, and the gate bus line connected to the output terminal of the current bistable circuit is set to be in a select state. With the increased potential of the netA, the transistor M6 is turned on, so that the potential of the netB is set to the low level.

At time point t3, the potential of the scanning signal Gout(k) is set to a low level. The potential of the netA is lowered compared to that of the period from t2 to t3, but is maintained at a high level state.

At time t4, when a pulse of the reset signal (Gout(k+3)) is supplied to the gate of the transistor M9, the potential of the netA is set to the low level.

The shift of characteristics of the output transistor M10 is particularly required to be suppressed among the plurality of transistors described above. Because of this, in the present embodiment, at least the output transistor M10 may be the first TFT having the first light blocking structure. On the other hand, since the positive shift is unlikely to occur in the transistors M3, M6, and M6+ with the drain electrodes connected to the netB, these transistors may be TFTs each including a light blocking layer to shield the entire channel region from light (second light blocking structure).

The configuration of the gate driver of the present embodiment is not limited to the illustrated example. The present embodiment may be applied to various known gate drivers. For the purpose of reference, regarding the configuration and action of the gate driver, the entire contents of the disclosure of JP 2019-138923 A and JP 2010-192019 A are incorporated herein by reference. In the above description, the example in which the gate driver is formed in the non-display region is represented, but the gate driver may be formed in the pixel area.

Manufacturing Method for Active Matrix Substrate 1001

Next, an example of a manufacturing method for the active matrix substrate according to the present embodiment will be described with reference to the accompanying drawings. A method for manufacturing the first TFT 100 as a circuit TFT (for example, FIGS. 2A and 2B) and the second TFT 200 as a pixel TFT (FIG. 16) will be mainly described herein.

FIG. 19 is a diagram illustrating a process flow for explaining an example of the manufacturing method for the active matrix substrate 1001.

Step 1: Formation of Lower Metal Layer

A lower conductive film (having a thickness, for example, 50 nm or more and 500 nm or less) is formed on the substrate 1 by, for example, a sputtering method. Next, patterning of the lower conductive film is performed by a known photolithography process (for example, wet etching). In this way, a lower metal layer including the light blocking layers 103 and 203 of the first TFT and second TFT is formed.

As the substrate 1, a transparent substrate with insulating properties, for example, a glass substrate, a silicon substrate, a heat-resistant plastic substrate (resin substrate), or the like can be used.

The material of the lower conductive film is not particularly limited, and a film containing a metal such as aluminum (Al), tungsten (W), molybdenum (Mo), tantalum (Ta), chromium (Cr), titanium (Ti) or copper (Cu), an alloy thereof, or a metal nitride thereof may be appropriately used. Further, a layered film obtained by layering such a plurality of films may be used. Here, as the lower conductive film, a layered film (Cu/Ti film) is used which includes a Ti film (having a thickness of 30 nm) and a Cu film (having a thickness of 200 nm) in this order from the substrate 1 side.

Step 2: Formation of Lower Insulating Layer 5

Subsequently, the lower insulating layer 5 (having a thickness of, for example, 200 nm or more and 600 nm or less) is formed to cover the lower metal layer.

The lower insulating layer 5 is formed by a CVD method, for example. As the lower insulating layer 5, a silicon oxide (SiOx) layer, a silicon nitride (SiNx) layer, a silicon oxynitride (SiOxNy; x>y) layer, a silicon nitride oxide (SiNxOy; x>y) layer, or the like may be used as appropriate. The lower insulating layer 5 may be a single layer or may include a layered structure. For example, a silicon nitride (SiNx) layer, a silicon nitride oxide layer, or the like may be formed on the substrate side (lower layer) in order to prevent diffusion of impurities and the like from the substrate 1, and a silicon oxide ($SiO_2$) layer, a silicon oxynitride layer, or the like may be formed on a layer (upper layer) on the former layer in order to secure insulating properties. A layered film having a silicon nitride (SiNx) layer (having a thickness of 50 to 600 nm) as a lower layer and a silicon oxide ($SiO_2$) layer (having a thickness of 50 to 600 nm) as an upper layer may be formed as the lower insulating layer 5. In a case where the oxide film such as a silicon oxide film or the like is used as the lower insulating layer 5 (or in a case where the lower insulating layer 5 has a layered structure, as the top layer thereof), oxidation defects generated in the channel region of the oxide semiconductor layer that is subsequently formed can be reduced by the oxide film, and thus, the channel region being low-resistive may be suppressed.

Step 3: Formation of Oxide Semiconductor Layers 107 and 207

Subsequently, an oxide semiconductor film is formed on the lower insulating layer 5. Subsequently, annealing treatment of the oxide semiconductor film may be performed. A thickness of the oxide semiconductor film may be, for example, 5 nm or more and 200 nm or less.

Subsequently, patterning of the oxide semiconductor film is performed with a known photolithography process. The patterning of the oxide semiconductor film may be performed by, for example, wet etching using a PAN-based etching solution containing phosphoric acid, nitric acid, and acetic acid, or an oxalic acid-based etching solution. As a result, the oxide semiconductor layers 107 and 207 serving as the active layers of the first TFT and the second TFT are obtained.

The oxide semiconductor film may be formed by a sputtering method, for example. As the oxide semiconductor film, an In—Ga—Zn—O based semiconductor film (having a thickness of 50 nm) containing In, Ga, and Zn is formed.

Step 4: Formation of Gate Insulating Layer and Gate Metal Layer

Subsequently, a gate insulating film (having a thickness of, for example, 80 nm or more and 250 nm or less) and a gate conductive film (having a thickness of, for example, 50 nm or more and 500 nm or less) are formed in this order to cover the oxide semiconductor layers 107 and 207.

As the gate insulating film, an insulating film similar to the lower insulating layer 5 (the insulating film exemplified as the lower insulating layer 5) may be used. As the gate insulating film, a silicon oxide ($SiO_2$) layer is formed. In a case where an oxide film such as a silicon oxide film is used as the insulating film, oxidation defects generated in the channel regions of the oxide semiconductor layers 107 and 207 can be reduced by the oxide film, and thus, the channel region being low-resistive may be suppressed.

As the gate conductive film, for example, a metal such as molybdenum (Mo), tungsten (W), aluminum (Al), copper (Cu), titanium (Ti) or tantalum (Ta), or an alloy thereof may be used. The gate conductive film may have a layered structure including a plurality of layers made of different conductive materials. As the gate conductive film, used is a Cu/Ti layered film having a Ti film as a lower layer and a Cu film as an upper layer, or a Cu/Mo layered film having a Mo film as a lower layer and a Cu film as an upper layer.

Thereafter, a resist layer is formed on the gate conductive film, and the gate conductive film is patterned using the resist layer as a mask to form a gate metal layer including the gate electrodes GE and GE2 and the gate bus line GL. Subsequently, the gate insulating film is etched using the resist layer or the gate metal layer as a mask, thereby obtaining the gate insulating layers 109 and 209. As a result, regions of the oxide semiconductor layers 107 and 207 overlapping the gate electrodes GE and GE2 with the gate insulating layers 109 and 209 interposed therebetween become the channel regions 107c and 207c, respectively.

Step 5: Processing for Lowering Resistance and Formation of Interlayer Insulating Layer 10

Subsequently, processing for lowering the resistance of the oxide semiconductor layers 107 and 207 may be performed. Plasma processing may be performed as the processing for lowering the resistance, for example. As a result, when viewed from the normal direction of the main surface of the substrate 1, the regions of the oxide semiconductor layers 107 and 207 respectively located on both sides of the channel regions 107c and 207c and exposed (the first region and second region) are low-resistive regions having specific resistance lower than that of the channel regions 107c and 207c. The low-resistive region may be a conductive region (for example, sheet resistance is not greater than 200 Ω/sq).

Subsequently, the interlayer insulating layer 10 for covering the oxide semiconductor layers 107 and 207, the gate insulating layers 109 and 209, and the gate metal layer is formed. The interlayer insulating layer 10 can be formed with a single-layer or a multi-layer of an inorganic insulating layer such as a silicon oxide film, a silicon nitride film, a silicon oxynitride film, a silicon nitride oxide film and the like. The thickness of the inorganic insulating layer may be 100 nm or more and 500 nm or less. It is preferable to form the interlayer insulating layer 10 by using an insulating film that reduces an oxide semiconductor such as a silicon nitride film, because the specific resistance of the regions of the oxide semiconductor layers 107 and 207 in contact with the interlayer insulating layer 10 (in this case, low-resistive regions) can be maintained low. As the interlayer insulating layer 10, a layered film having an $SiO_2$ layer as a lower layer and an SiNx layer as an upper layer is formed by a CVD method, for example.

Thereafter, the interlayer insulating layer 10 is patterned by, for example, dry etching. With this, the source openings 110s and 210s exposing part of the first regions (source contact regions) of the oxide semiconductor layers 107 and 207, and the drain openings 110d and 210d exposing part of the second regions (drain contact regions) are formed in the interlayer insulating layer 10.

Step 6: Formation of Source Metal Layer

Subsequently, a source conductive film (having a thickness of, for example, 50 nm or more and 500 nm or less) is formed on the interlayer insulating layer 10, and then the source conductive film is patterned. With this, an upper metal layer including the source electrodes SE and SE2, the drain electrodes DE and DE2, and the source bus lines SL is formed. The source electrodes SE and SE2 are connected to the first regions of the oxide semiconductor layers 107 and 207 within the source openings 110s and 210s, respectively. The drain electrodes DE and DE2 are connected to the second regions of the oxide semiconductor layers 107 and 207 within the drain openings 110d and 210d. In this manner, the first TFT 100 and the second TFT 200 are manufactured.

As the source conductive film, an element selected from aluminum (Al), chromium (Cr), copper (Cu), tantalum (Ta), titanium (Ti), molybdenum (Mo) and tungsten (W), or an alloy containing these elements as components may be used, for example. For example, a triple-layer structure of titanium film-aluminum film-titanium film or a triple-layer structure of molybdenum film-aluminum film-molybdenum film or the like may be included. Here, a layered film having a Ti film (having a thickness of 15 to 70 nm) as a lower layer and a Cu film (having a thickness of 200 to 400 nm) as an upper layer is used.

Step 7: Formation of Inorganic Insulating Layer 11 and Organic Insulating Layer 12

Next, the upper insulating layer 13 is formed to cover the interlayer insulating layer 10 and the source metal layer. As the upper insulating layer 13, the inorganic insulating layer 11 (having a thickness of 100 nm or more to 500 nm or less, for example) and the organic insulating layer 12 (having a thickness of 1 to 3 μm, preferably 2 to 3 μm, for example) are formed in this order. The entirety of a portion of the organic insulating layer 12 located in the non-display region may be removed. Alternatively, the organic insulating layer 12 may not be formed.

As the inorganic insulating layer 11, an inorganic insulating film similar to the interlayer insulating layer 10 (the insulating film exemplified as the interlayer insulating layer 10) may be used. Here, as the inorganic insulating layer 11, for example, an SiNx layer (having a thickness of 300 nm) is formed by the CVD method. The organic insulating layer 12 may be, for example, an organic insulating film containing a photosensitive resin material (for example, an acrylic resin film).

Next, the organic insulating layer 12 is patterned. With this, in each pixel area PIX, a first opening for exposing part of the inorganic insulating layer 11 is formed in the organic insulating layer 12. The first opening is arranged to overlap the drain electrode DE2 of the pixel TFT (second TFT) when viewed from the normal direction of the substrate 1.

Step 8: Formation of Common Electrode CE

Subsequently, the common electrode CE is formed on the upper insulating layer 13.

First, a first transparent conductive film (having a thickness of 20 to 300 nm) (not illustrated) is formed on the upper insulating layer 13 and in the first opening. For example, an indium zinc oxide film is formed as the first transparent conductive film by a sputtering method. Examples of a material of the first transparent conductive film may include metal oxide such as indium tin oxide (ITO), indium zinc oxide, and ZnO. Subsequently, patterning of the first transparent conductive film is performed. In the patterning, wet etching may be performed using an oxalic acid-based etching solution, for example. This allows the common electrode CE to be obtained. The common electrode CE may be disposed substantially across the entire display region excluding a pixel contact hole formation region where the pixel contact hole CHp is formed, for example.

Step 9: Formation of Dielectric Layer 17

Next, the dielectric layer 17 (having a thickness of 50 to 500 nm) is formed to cover the common electrode CE, and then the dielectric layer 17 and the inorganic insulating layer 11 are patterned.

The dielectric layer 17 is formed on the organic insulating layer 12 and the common electrode CE and within the first opening in the pixel area PIX. A material of the dielectric layer 17 may be the same as the material exemplified as the material of the inorganic insulating layer 11. Here, as the dielectric layer 17, for example, a SiN film is formed by the CVD method.

After that, a resist layer (not illustrated) is formed on the dielectric layer 17 by the photolithography process. The dielectric layer 17 and the inorganic insulating layer 11 are etched (for example, dry-etched) using the resist layer and the organic insulating layer 12 as a mask. The dielectric layer 17 and the inorganic insulating layer 11 may be etched in the same etching process. With this, the pixel contact hole CHp for exposing part of the second region of the oxide semiconductor layer 207 is formed in the pixel area PIX. The pixel contact hole CHp is constituted by the opening formed in the inorganic insulating layer 11, the first opening in the organic insulating layer 12, and the opening in the dielectric layer 17.

Step 10: Formation of Pixel Electrode PE

Then, a second transparent conductive film (having a thickness of 20 to 300 nm) (not illustrated) is formed on the dielectric layer 17 and in the pixel contact hole CHp. The material of the second transparent conductive film may be the same as the material exemplified as the material of the second transparent conductive film (for example, ITO).

Thereafter, the second transparent conductive film is patterned. The second transparent conductive film may be wet-etched using an oxalic acid-based etching solution, for example. With this, the pixel electrode PE is obtained. In the pixel area PIX, the pixel electrode PE is formed on the dielectric layer 17 and in the pixel contact hole CHp, and is connected to the drain electrode DE2 of the pixel TFT in the pixel contact hole CHp. In this manner, the active matrix substrate 1001 is manufactured.

Oxide Semiconductor

The oxide semiconductor included in the oxide semiconductor layer of each TFT according to the present embodiment may be an amorphous oxide semiconductor or a crystalline oxide semiconductor including a crystalline portion. Examples of the crystalline oxide semiconductor include a polycrystalline oxide semiconductor, a microcrystalline oxide semiconductor, and a crystalline oxide semiconductor having a c-axis oriented substantially perpendicular to the layer surface.

The oxide semiconductor layer may have a layered structure including two or more layers. When the oxide semiconductor layer has the layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. The oxide semiconductor layer may include a plurality of amorphous oxide semiconductor layers. In a case where the oxide semiconductor layer has a dual-layer structure including an upper layer and a lower layer, an energy gap of the oxide semiconductor included in a layer positioned on the gate electrode side of the dual-structure (that is the lower layer in the case of the bottom gate structure, and the upper layer in the case of the top gate structure) may be smaller than an energy gap of the oxide semiconductor included in a layer positioned opposite to the gate electrode (that is the upper layer in the case of the bottom gate structure, and the lower layer in the case of the top gate structure). However, in a case where a difference in the energy gap between these layers is relatively small, the energy gap of the oxide semiconductor included in the layer positioned on the gate electrode side may be greater than the energy gap of the oxide semiconductor included in the layer positioned opposite to the gate electrode.

Materials, structures, and film formation methods of an amorphous oxide semiconductor and the above-described crystalline oxide semiconductors, a configuration of an oxide semiconductor layer having a layered structure, and the like are described in, for example, JP 2014-007399 A. The entire contents of the disclosure of JP 2014-007399 A are incorporated herein by reference.

The oxide semiconductor layer may include, for example, at least one metal element selected from In, Ga, and Zn. In the present embodiment, the oxide semiconductor layer includes, for example, an In—Ga—Zn—O based semiconductor (for example, an indium gallium zinc oxide). Here, the In—Ga—Zn—O based semiconductor is a ternary oxide of indium (In), gallium (Ga), and zinc (Zn), and a ratio (composition ratio) of In, Ga, and Zn is not particularly limited. For example, the ratio includes In:Ga:Zn=2:2:1, In:Ga:Zn=1:1:1, or In:Ga:Zn=1:1:2. Such an oxide semiconductor layer can be formed of an oxide semiconductor film including an In—Ga—Zn—O based semiconductor.

The In—Ga—Zn—O based semiconductor may be an amorphous semiconductor or may be a crystalline semiconductor. A crystalline In—Ga—Zn—O based semiconductor in which a c-axis is oriented substantially perpendicular to a layer surface is preferable as the crystalline In—Ga—Zn—O based semiconductor.

Note that a crystal structure of the crystalline In—Ga—Zn—O based semiconductor is disclosed in, for example, JP 2014-007399 A, JP 2012-134475 A, and JP 2014-209727 A as described above. The entire contents of the disclosure of JP 2012-134475 A and JP 2014-209727 A are incorporated herein by reference. A TFT including an In—Ga—Zn—O based semiconductor layer has a high mobility (more than 20 times compared to an a-Si TFT) and a low leakage current (less than one hundredth compared to the a-Si TFT), and therefore such TFT is suitably used as a drive TFT (for example, a TFT included in a drive circuit that is provided around a display region including a plurality of pixels on the same substrate as the display region) and a pixel TFT (TFT provided in a pixel).

In place of the In—Ga—Zn—O based semiconductor, the oxide semiconductor layer may include another oxide semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of indium (In), tin (Sn), and zinc (Zn). Alternatively, the oxide semiconductor layer may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, cadmium oxide (CdO), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, an In—Ga—Zn—Sn—O based semiconductor, an In—W—Zn—O based semiconductor, and the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An active matrix substrate comprising:
a substrate;
a plurality of source bus lines and a plurality of gate bus lines that are supported by the substrate; and
a plurality of oxide semiconductor TFTs supported by the substrate, each of the plurality of oxide semiconductor TFTs including an oxide semiconductor layer, a gate electrode disposed on part of the oxide semiconductor layer with a gate insulating layer interposed between the part of the oxide semiconductor layer and the gate electrode, a source electrode, and a drain electrode,
wherein the oxide semiconductor layer includes a channel region, a source contact region electrically connected to the source electrode, and a drain contact region electrically connected to the drain electrode,
the channel region is a region located between the source contact region and the drain contact region and overlapping the gate electrode in a view from a normal direction of the substrate, the channel region including, in a view from the normal direction of the substrate,
a first end portion and a second end portion that oppose each other and extend in a first direction from the source contact region side toward the drain contact region side,
a source side end portion that is located on the source contact region side of the first end portion and the second end portion and extends in a second direction that intersects the first direction, and
a drain side end portion that is located on the drain contact region side of the first end portion and the second end portion and extends in the second direction,
the plurality of oxide semiconductor TFTs include a plurality of first TFTs, and each of the plurality of first TFTs further includes a light blocking layer located between the oxide semiconductor layer and the substrate,
the light blocking layer includes an opening region that overlaps part of the channel region and a light blocking region that overlaps another part of the channel region, in a view from the normal direction of the substrate,
the light blocking region includes a first light blocking portion that extends in the first direction over the first end portion of the channel region and a second light blocking portion that extends in the first direction over the second end portion of the channel region, in a view from the normal direction of the substrate, and
each of the first light blocking portion and the second light blocking portion includes a first edge portion and a second edge portion that oppose each other and extend in the first direction, at least part of the first edge portion overlaps the channel region, and the second edge portion is located on an outer side of the channel region and does not overlap the channel region, in a view from the normal direction of the substrate.

2. The active matrix substrate according to claim 1, wherein, in each of the plurality of first TFTs, the light blocking layer further includes a third light blocking portion that extends in the second direction over the source side end portion of the channel region and a fourth light blocking portion that extends in the second direction over the drain side end portion of the channel region, in a view from the normal direction of the substrate, and
each of the third light blocking portion and the fourth light blocking portion includes a third edge portion and a fourth edge portion that oppose each other and extend in the second direction, at least part of the third edge portion overlaps the channel region, and the fourth edge portion is located on the outer side of the channel region and does not overlap the channel region.

3. The active matrix substrate according to claim 1, wherein, in each of the plurality of first TFTs, a length of a portion of the first end portion covered with the first light blocking portion is substantially equal to a length of a portion of the second end portion covered with the second light blocking portion.

4. The active matrix substrate according to claim 1, wherein, in each of the plurality of first TFTs, a width in a direction orthogonal to the first direction is not less than 3 µm and is less than half a channel width of each of the plurality of first TFTs in the first light blocking portion and the second light blocking portion.

5. The active matrix substrate according to claim 1, wherein, in each of the plurality of first TFTs, the light blocking layer further includes an intermediate light blocking portion that is located between the first light blocking portion and the second light blocking portion and at least partially overlaps the channel region, in a view from the normal direction of the substrate, and
the opening region includes a first opening region and a second opening region that are disposed across the intermediate light blocking portion in a view from the normal direction of the substrate.

6. An active matrix substrate comprising:

a substrate;

a plurality of source bus lines and a plurality of gate bus lines that are supported by the substrate; and a plurality of oxide semiconductor TFTs supported by the substrate, each of the plurality of oxide semiconductor TFTs including an oxide semiconductor layer, a gate electrode disposed on part of the oxide semiconductor layer with a gate insulating layer interposed between the part of the oxide semiconductor layer and the gate electrode, a source electrode, and a drain electrode, wherein the oxide semiconductor layer includes a channel region, a source contact region electrically connected to the source electrode, and a drain contact region electrically connected to the drain electrode, the channel region is a region located between the source contact region and the drain contact region and overlapping the gate electrode in a view from a normal direction of the substrate, the channel region including, in a view from the normal direction of the substrate, a first end portion and a second end portion that oppose each other and extend in a first direction from the source contact region side toward the drain contact region side, a source side end portion that is located on the source contact region side of the first end portion and the second end portion and extends in a second direction that intersects the first direction, and a drain side end portion that is located on the drain contact region side of the first end portion and the second end portion and extends in the second direction, the plurality of oxide semiconductor TFTs include a plurality of first TFTs, and each of the plurality of first TFTs further includes a light blocking layer located between the oxide semiconductor layer and the substrate, the light blocking layer includes an opening region that overlaps part of the channel region and a light blocking region that overlaps another part of the channel region, in a view from the normal direction of the substrate, the light blocking region further includes a third light blocking portion that extends in the second direction over the source side end portion of the channel region and a fourth light blocking portion that extends in the second direction over the drain side end portion of the channel region, in a view from the normal direction of the substrate, and each of the third light blocking portion and the fourth light blocking portion includes a third edge portion and a fourth edge portion that oppose each other and extend in the second direction, at least part of the third edge portion overlaps the channel region, and the fourth edge portion is located on an outer side of the channel region and does not overlap the channel region.

7. The active matrix substrate according to claim 2, wherein, in each of the plurality of first TFTs, a length of a portion of the source side end portion covered with the third light blocking portion is substantially equal to a length of a portion of the drain side end portion covered with the fourth light blocking portion.

8. The active matrix substrate according to claim 2, wherein, in each of the plurality of first TFTs, a width in a direction orthogonal to the second direction is not less than 3 μm and is less than half a channel length of each of the plurality of first TFTs in the third light blocking portion and the fourth light blocking portion.

9. The active matrix substrate according to claim 1, wherein, in each of the plurality of first TFTs, the opening region includes an opening, a notched portion, or a recessed portion of the light blocking layer in a view from the normal direction of the substrate.

10. The active matrix substrate according to claim 1, wherein, in at least some first TFTs among the plurality of first TFTs, the gate electrode includes a first gate portion and a second gate portion electrically connected to each other, the channel region includes a first channel portion overlapping the first gate portion, and a second channel portion located on the drain electrode side relative to the first channel portion and overlapping the second gate portion, in a view from the normal direction of the substrate, the light blocking layer includes a first layer overlapping part of the first channel portion and a second layer overlapping part of the second channel portion, in a view from the normal direction of the substrate, the first end portion of the channel region includes an end portion that extends in the first direction in the first channel portion and the second channel portion, and the second end portion of the channel region includes an end portion that opposes the first end portion and extends in the first direction in the first channel portion and the second channel portion, and the source side end portion is an end portion located on the source contact region side of the first channel portion, and the drain side end portion is an end portion located on the drain contact region side of the second channel portion.

11. The active matrix substrate according to claim 10, wherein at least the some first TFTs further include an intermediate electrode, and the intermediate electrode is electrically connected to a portion located between the first channel portion and the second channel portion in the oxide semiconductor layer in a view from the normal direction of the substrate.

12. The active matrix substrate according to claim 1, wherein the channel region of each of the plurality of first TFTs includes a light-blocked portion overlapping the light blocking region of the light blocking layer and a light-irradiated portion overlapping the opening region of the light blocking layer in a view from the normal direction of the substrate, and a ratio AR of an area of the light-blocked portion to an area of the channel region is in a range from 25% to 75%.

13. The active matrix substrate according to claim 1, wherein the active matrix substrate includes a display region having a plurality of pixel areas and a non-display region located around the display region and having a circuit formation region in which a peripheral circuit is formed, and the plurality of first TFTs are disposed in the circuit formation region.

14. The active matrix substrate according to claim 13, wherein the peripheral circuit includes an SSD circuit configured to distribute a display signal to a number n of source bus lines among the plurality of source bus lines, and the plurality of first TFTs include a plurality of SSD circuit TFTs constituting the SSD circuit, and each of the plurality of SSD circuit TFTs supplies a video signal to one corresponding source bus line of the number n of source bus lines.

15. The active matrix substrate according to claim 14, wherein no other TFT is formed between the plurality of SSD circuit TFTs and the display region.

16. The active matrix substrate according to claim 14, wherein the SSD circuit further includes a plurality of compensation TFTs each connected to one corresponding source bus line of the number n of source bus lines,
a gate electrode of each of the plurality of compensation TFTs is supplied with a signal having a phase opposite to a phase of a control signal supplied to a gate electrode of the SSD circuit TFT that is connected to an identical source bus line, and
a first TFT formation region in which the plurality of SSD circuit TFTs are disposed is located between a second TFT formation region in which the plurality of compensation TFTs are disposed and the display region.

17. The active matrix substrate according to claim 13, wherein the peripheral circuit further includes a gate driver connected to the plurality of gate bus lines, and the plurality of first TFTs include a plurality of gate driver TFTs constituting the gate driver.

18. The active matrix substrate according to claim 13, wherein the plurality of oxide semiconductor TFTs further include second TFTs disposed in each of the plurality of pixel areas, and
each second TFT includes another light blocking layer located between the oxide semiconductor layer and the substrate, and the another light blocking layer overlaps an entirety of the channel region of the second TFT in a view from the normal direction of the substrate.

19. The active matrix substrate according to claim 1, wherein the oxide semiconductor layer includes an In—Ga—Zn—O based semiconductor.

20. The active matrix substrate according to claim 19, wherein the In—Ga—Zn—O based semiconductor includes a crystalline portion.

* * * * *